(12) United States Patent
Austin et al.

(10) Patent No.: US 7,378,890 B2
(45) Date of Patent: May 27, 2008

(54) PROGRAMMABLE LOW-POWER HIGH-FREQUENCY DIVIDER

(75) Inventors: John S. Austin, Winooski, VT (US); Ram Kelkar, South Burlington, VT (US); Pradeep Thiagarajan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/857,632

(22) Filed: Sep. 19, 2007

(65) Prior Publication Data

US 2008/0007310 A1  Jan. 10, 2008

Related U.S. Application Data

(60) Division of application No. 11/325,786, filed on Jan. 5, 2006, now Pat. No. 7,342,429, which is a continuation-in-part of application No. 11/070,730, filed on Mar. 2, 2005, now Pat. No. 7,075,350, which is a division of application No. 10/661,050, filed on Sep. 11, 2003, now Pat. No. 6,917,662.

(51) Int. Cl.
*H03K 3/289* (2006.01)
*H03K 3/356* (2006.01)
(52) U.S. Cl. .............. 327/202; 327/203; 327/208; 327/218
(58) Field of Classification Search ............. None
See application file for complete search history.

(56) References Cited

U.S. PATENT DOCUMENTS

| | | | | |
|---|---|---|---|---|
| 4,856,034 A * | 8/1989 | Takeuchi et al. | ............... | 377/74 |
| 5,917,355 A | 6/1999 | Klass | | |
| 5,990,717 A * | 11/1999 | Partovi et al. | ............... | 327/210 |
| 6,646,487 B2 * | 11/2003 | Nedovic et al. | ............. | 327/211 |
| 2002/0075222 A1 * | 6/2002 | Miyatake | ..................... | 345/100 |

FOREIGN PATENT DOCUMENTS

| JP | PUPA61-198817 | 9/1986 |
|---|---|---|
| JP | PUPA05-327484 | 12/1993 |
| JP | PUPA06-045915 | 2/1994 |
| JP | PUPA07-170173 | 7/1995 |
| JP | PUPA08-162946 | 6/1996 |
| JP | PUPA10-111674 | 4/1998 |
| JP | PUPA11-111940 | 4/1999 |

(Continued)

OTHER PUBLICATIONS

W. N. Carr et al.; MOS/LSI Design and Application McGraw-Hill Corp; 1972;pp. 77, pp. 126.

(Continued)

*Primary Examiner*—Tuan T Lam
(74) *Attorney, Agent, or Firm*—Schmeiser, Olsen & Watts; Todd M. C. Li

(57) ABSTRACT

Several latch circuits including a NAND gate stage and combinations of clocked inverter stages and inverter stages are described. A programmable frequency divider including homologue frequency divider circuits using the latch circuits is also described. Also described is a circuit included in the homologue frequency divides and a method for correcting the duty cycle of clock signals generated by the homologue frequency dividers to 50%.

12 Claims, 15 Drawing Sheets

FOREIGN PATENT DOCUMENTS

| | | |
|---|---|---|
| JP | PUPA11-154710 | 6/1999 |
| JP | PUPA2000-181946 | 6/2000 |
| JP | PUPA2000-209082 | 7/2000 |
| JP | PUPA2000-509222 | 7/2000 |
| JP | PUPA2002-043930 | 2/2002 |
| JP | PUPA2003-188719 | 7/2003 |
| JP | PUPA09-307430 | 9/2007 |
| WO | WO 97/40497 | 10/1997 |

OTHER PUBLICATIONS

T. Yuyama; Design of Digital IC Circuit; CQ Publishing Co. Ltd.; Jan. 10, 1987; 13 pages.

S. Yamamoto; Digital Circuit; Hirokawa Publishing Co.; Sep. 25, 1974; 12 pages.

* cited by examiner

PROGRAMMABLE LOW-POWER HIGH-FREQUENCY DIVIDER

RELATED APPLICATIONS

This Application is a division of U.S. patent application Ser. No. 11/325,786 filed on Jan. 5, 2006 now U.S. Pat. No. 7,342,429 which is continuation-in-part of U.S. patent application Ser. No. 11/070,730, filed on Mar. 2, 2005, now U.S. Pat. No. 7,075,350 which is a divisional of U.S. patent application Ser. No. 10/661,050; filed on Sep. 11, 2003 now U.S. Pat. No. 6,917,662.

FIELD OF THE INVENTION

The present invention relates to the field of integrated circuits; more specifically, it relates to programmable high-frequency divider circuit with low power consumption.

BACKGROUND OF THE INVENTION

Computer systems employ data input, storage, processing and output integrated circuits. In order to assure proper operation of these circuits, they often need to be time-domain synchronized. In order to provide such synchronization, computer systems typically employ clock circuits for synchronizing the data transfer and process timing of these circuits. Synchronization of these circuits in modern high-performance and low-power computers requires several clock signals of varying frequency that themselves must be synchronized to one another. It is not a trivial undertaking to design such clock circuits that operate at multiple frequencies, with high-speed and with low power consumption.

SUMMARY OF THE INVENTION

A first aspect of the present invention is a master/slave latch comprising: a master latch comprising: a NAND gate having a clock signal input, a data signal input and an output; and an N-clocked inverter stage, a first input of said N-clocked inverter stage connected to said output of said NAND gate and a second input of said clocked inverter connected to said clock signal input; and a slave latch, comprising: a first P-clocked inverter stage, a first input of said first P-clocked inverter stage connected to an output of said N-clocked inverter stage and a second input of said first P-clocked inverter stage connected to said clock signal input; and a second P-clocked inverter stage having an output, an input of said second P-clocked inverter stage connected to an output of said first P-clocked inverter stage and a second input of said second P-clocked inverter stage connected to said clock signal input.

A second aspect of the present invention is a master/slave latch comprising: a master latch comprising: a NAND gate having a first clock signal input, a data signal input and an output; and an N-clocked inverter stage, a first input of said N-clocked inverter stage connected to said output of said NAND gate and a second input of said clocked inverter connected to said first clock signal input; and a slave latch, comprising: a first dual-clocked inverter stage, a first input of said dual-clocked inverter stage connected to an output of said N-clocked inverter stage, a second input of said dual-clocked inverter stage connected to said first clock signal input and a third input of said dual-clocked inverter stage connected to a second clock signal input; and an inverter stage having an output, an input of said inverter stage connected to an output of said dual-clocked inverter stage.

A third aspect of the present invention is a clock duty cycle correction circuit, comprising: the master/slave latch according to the second aspect; a first inverter connected between the output of the inverter stage of the slave latch and a first input of a first NAND gate, a second input of the first NAND gate connected to a control signal input of the duty cycle correction circuit; a buffer connected between the data signal input and a first input of a second NAND gate, an output of the first NAND gate connected to a second input of the second NAND gate; and a second inverter connected between an output of the second NAND gate and a output of the clock duty cycle correction circuit.

A fourth aspect of the present invention is a frequency divider, comprising: a serial shift register comprising at least two master/slave latches according to claim 1, a data output of each master/slave latch of the shift register connected to a data input of one different master/slave latch of the shift register and a data output of a last master/slave latch of the shift register connected to a data input of a first master/slave latch of the shift register; an output of the frequency divider connected to a data output of a next to last master/slave latch of the shift register; and wherein, a frequency of an output clock signal of the frequency divider is a function of a frequency of an input clock signal to the frequency divider and a number of master/slave latches in the shift register.

A fifth aspect of the present invention is a programmable frequency divider, comprising: a multiplicity of frequency dividers according to the fourth aspect of the present invention, each frequency divider having a different clock signal output; wherein a number of master/slave latches in each frequency divider is different; means for generating a different reset signal for each frequency divider; and means for selecting and connecting said clock signal output of one of said frequency dividers to a clock output of said programmable frequency divider.

A sixth aspect of the present invention is a method, comprising: generating, from a first clock signal having a first clock cycle time, a second clock signal having a second clock cycle time, said second clock cycle time greater than said first clock cycle time, an off-time of one cycle of said second clock signal being one first clock cycle time less than an on-time of one cycle of said second clock signal; shifting in time said second clock signal by half the first clock cycle time to generate a third clock signal having a third clock cycle time, said second clock cycle time equal to said third clock cycle time; performing a logical AND of said second clock signal and said third clock signal to generate a fourth clock signal having a fourth cycle time, said third cycle time equal to said fourth cycle time, an on-time of one cycle of said fourth clock signal equal to an off-time of one cycle of said fourth clock signal.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Unless otherwise noted it should be understood that when a signal is described as divided by a number, it is meant that the frequency of the signal is divided by that number. Unless otherwise stated a signal described as low or zero (0) is a logical 0 and a signal described as a high or one (1) is a logical 1. Transitions from 1 to 0 (high to low) or 0 to 1 (low to high) are similarly defined as logical transitions.

Figure 8:
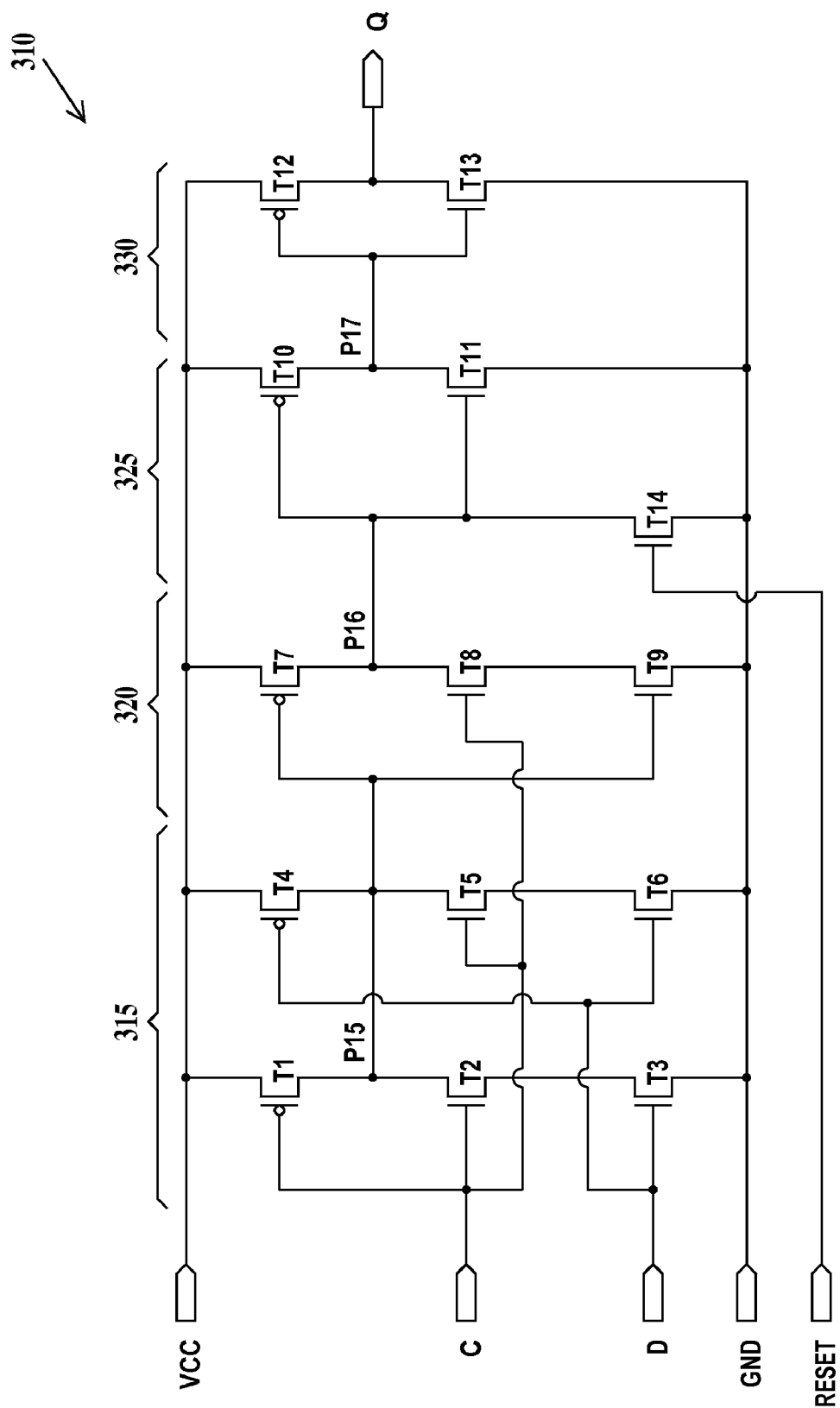
FIG. 8 is a schematic diagram of a first fast latch according to embodiments of the present invention.
Figure 10:
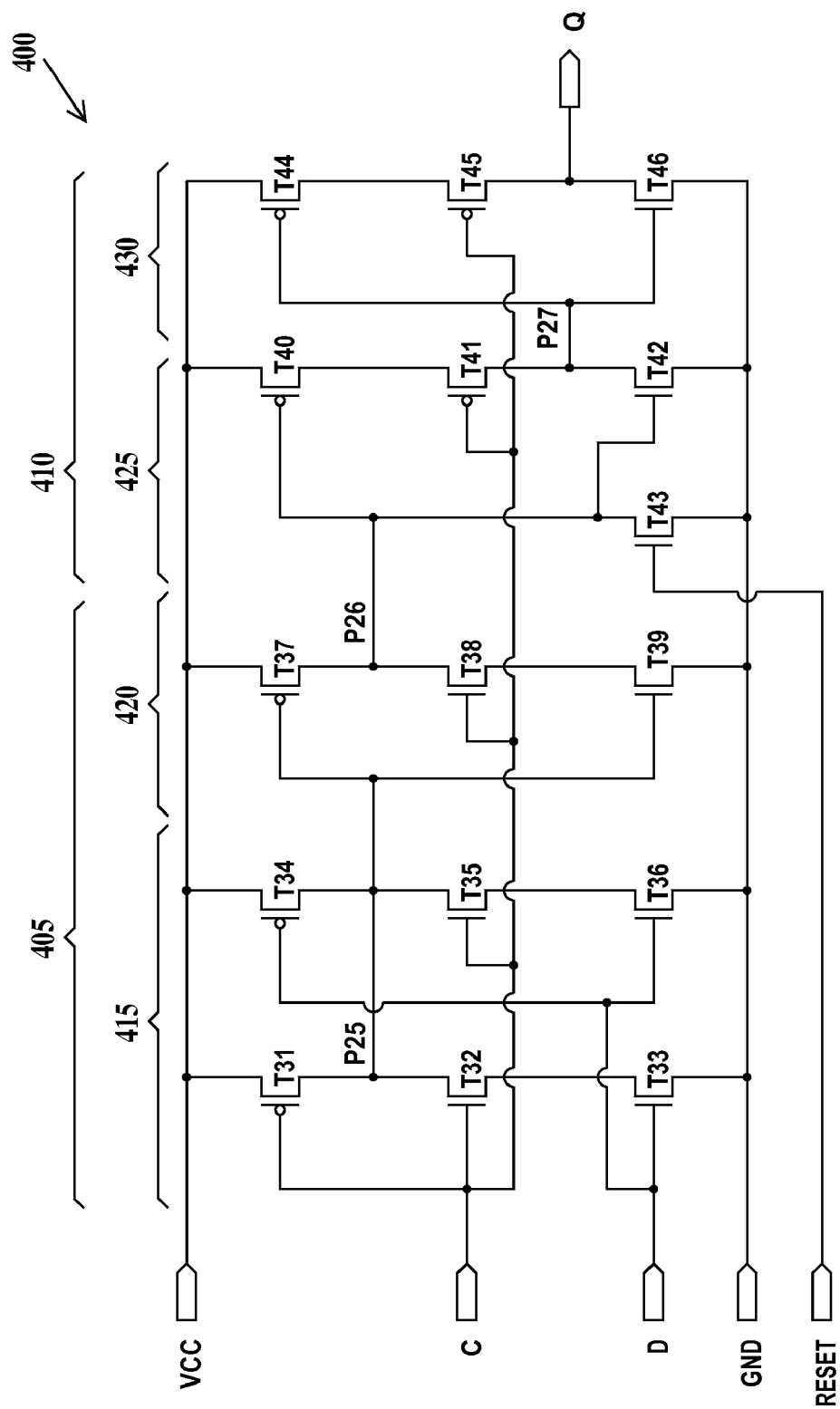
FIG. 10 is a schematic diagram of a first fast master/slave latch according to embodiments of the present invention.
Figure 11:
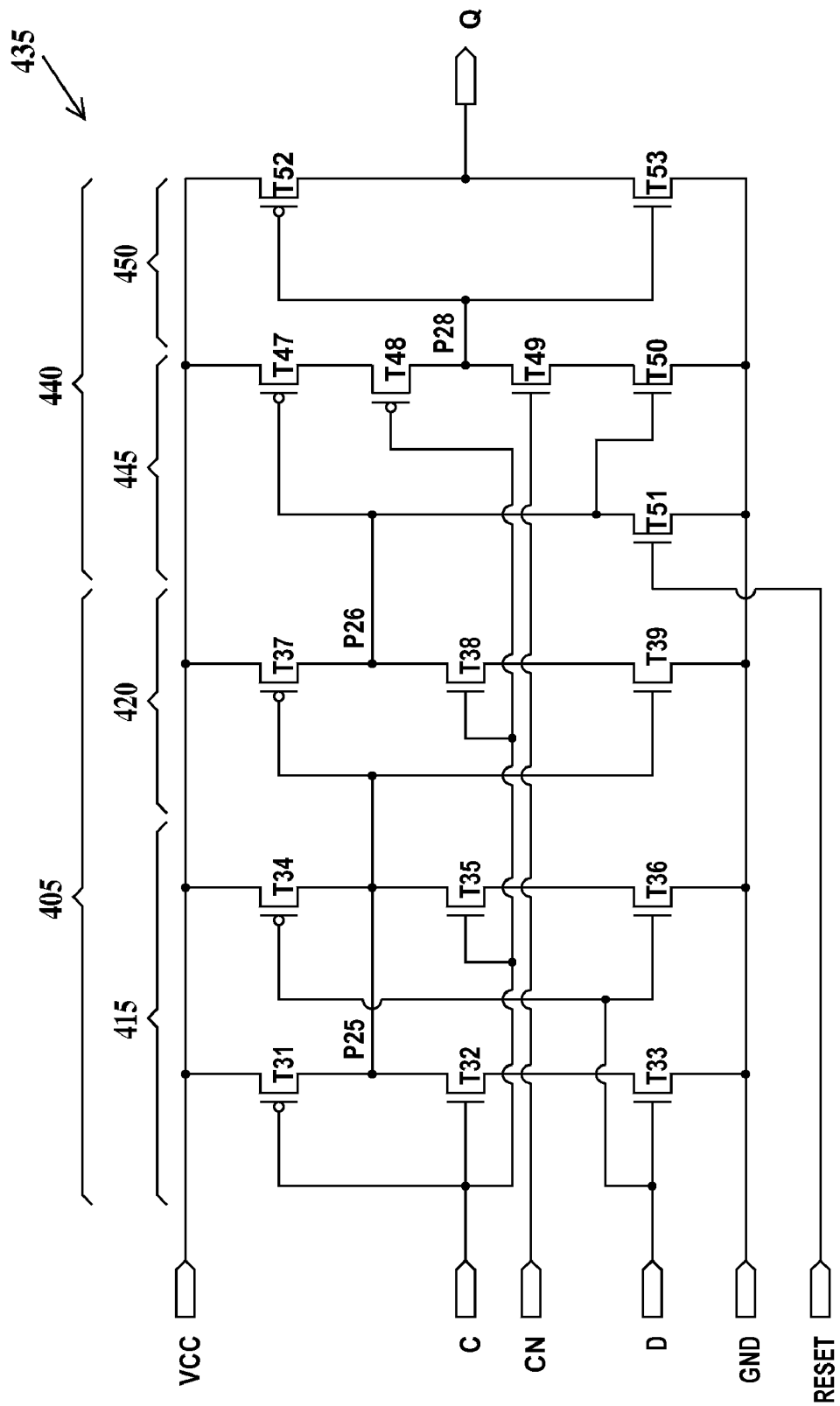
FIG. 11 is a schematic diagram of a second fast master/slave latch according to embodiments of the present invention.

The present invention utilizes a unique circuit for dividing frequencies by two, two different types of circuits for dividing frequencies by three or four and a homologous set of circuits for frequency division above two (the second type of circuit for dividing by three or four is the lowest member of this set of homologous circuits). The term fast latch refers to a novel latch of the present invention. The fast latch of the present invention has low power consumption and very fast latching speed and is illustrated in FIG. 8 and described infra. The term fast master/slave latch refers to additional novel latches of the present invention. The fast master/slave latches of the present invention have low power consumption and very fast latching speed and are illustrated in FIGS. 10 and 11 and described infra.

An inverter is comprised of a PFET and an NFET, the gates of the PFET and NFET connected to an input of the inverter, drains of the PFET and the NFET connected to the output of the inverter, the source of the PFET connected to VCC (a high voltage terminal of a power supply) and the source of the NFET connected to ground (a low voltage terminal of a power supply.)

An N-clocked inverter is defined as an inverter comprising: a PFET, a first NFET and a second NFET, a gate of the first NFET connected to a clock signal, gates of the PFET and second NFET connected to an input of the inverter, drains of the PFET and the first NFET connected to an output of the inverter, a source of the first NFET connected to the drain of the second NFET, a source of the PFET connected to VCC (a high voltage terminal of a power supply) and the source of the second NFET connected to ground (a low voltage terminal of the power supply).

A P-clocked inverter is defined as an inverter comprising: a first PFET, a second PFET and an NFET, a gate of the second PFET connected to a clock signal, gates of the first PFET and the NFET connected to an input of the inverter, drains of the second PFET and the NFET connected to an output of the inverter, a drain of the first PFET connected to a source of the second PFET, a source of the first PFET connected to VCC (a high voltage terminal of a power supply) and the source of the NFET connected to ground (a low voltage terminal of the power supply).

A dual-clocked inverter is defined as an inverter comprising: a first PFET, a second PFET, a first NFET and a second NFET, gates of the first PFET and second NFET connected to an input of the dual clocked inverter stage, a gate of the second PFET connected to a first clock signal input and a gate of the first NFET connected to a second clock signal input (the signal impressed on the second clock input is the complement of the clock signal impressed on the first clock signal input), drains of the second PFET and the first NFET connected to an output of the inverter, a source of the first NFET connected to a drain of the second NFET, a drain of the first PFET connected a source of the second PFET, a source of the first PFET connected to VCC (a high voltage terminal of a power supply) and a source of the second NFET connected to ground (a low voltage terminal of the power supply).

Figure 1:
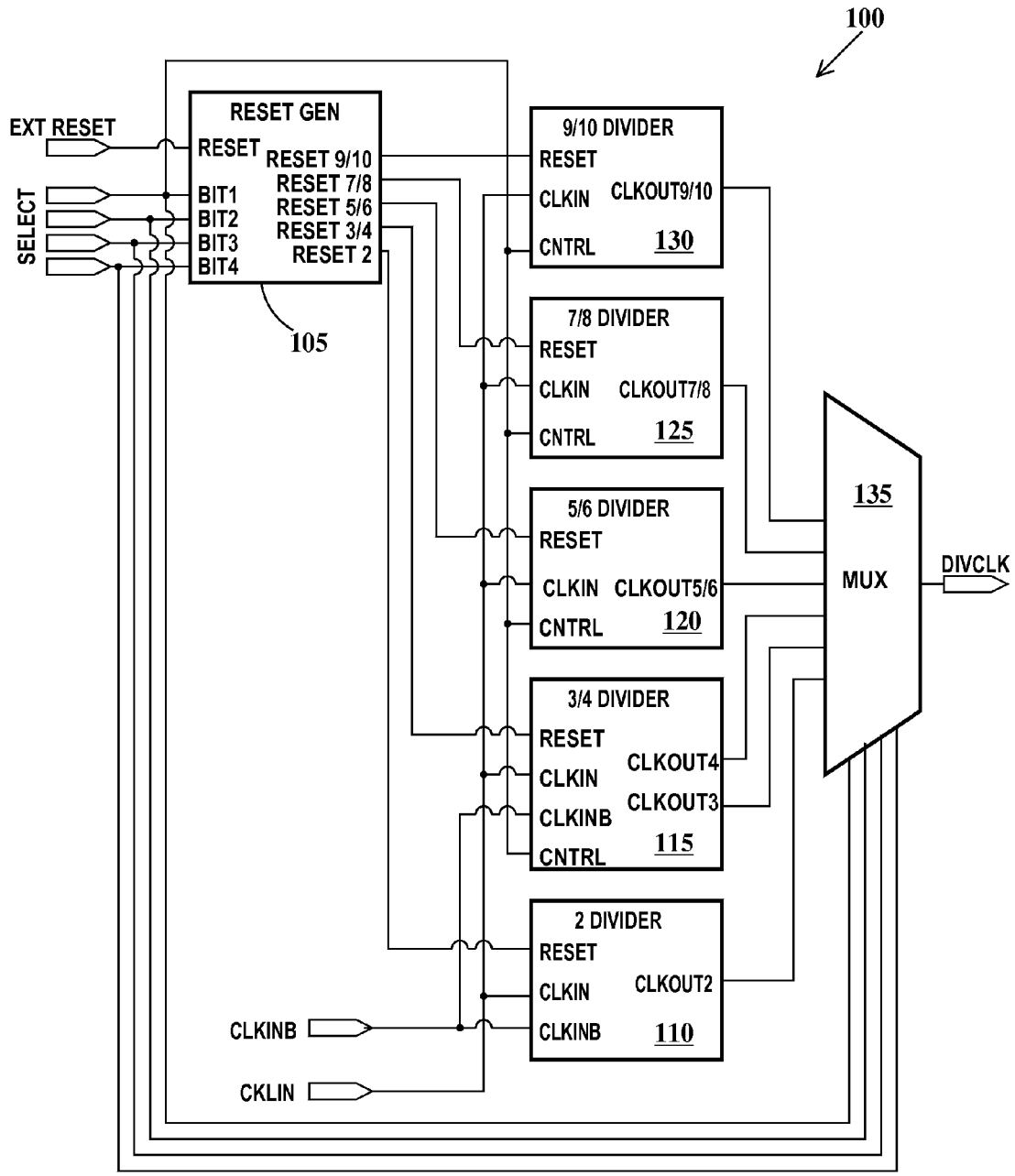
FIG. 1 is a schematic diagram of an exemplary programmable frequency divider according to embodiments of the present invention.

FIG. 1 is a schematic diagram of an exemplary programmable frequency divider according to the present invention. A frequency divide circuit produces an output clock signal numerically equal to the frequency of an input clock signal divided by a fixed number, often a whole positive integer. In FIG. 1, a programmable frequency divider circuit 100 for outputting an output clock signal DIVCLK based on inputted clock signals CLKIN and CLKINB includes a reset generator 105, a divide frequency by two circuit (2divider) 110, a divide frequency by three or four circuit (3/4divider) 115, divide frequency by five or six circuit (5/6 divider) 120, a divide frequency by seven or eight circuit (7/8divider) 125, a divide frequency by nine or ten circuit (9/10divider) 130 and an inverting multiplexer 135. The number of frequency divider circuits is exemplary and more or less may be used and the numerical division of frequency may be changed as well. The notation CLKINB denotes the complement of CLKIN.

Reset generator 105 is coupled to an external reset signal EXT RESET for resetting the state of programmable frequency divider circuit 100 and a four-bit SELECT signal (having bits BIT1, BIT2, BIT3 and BIT4) for selecting the divide value that the frequency of CLKIN is to be divided by. Reset generator 105 generates a RESET2 signal coupled to a RESET input of 2 divider 110, a RESET3/4 signal coupled to a RESET input of 3/4 divider 115, a RESET5/6 signal coupled to a RESET input of 5/6 divider 120, a RESET7/8 signal coupled to a RESET input of 7/8 divider 125 and a RESET9/10 signal coupled to a RESET input of 9/10 divider 130. CLKIN is coupled to respective CLKIN inputs of 2 divider 110, 3/4 divider 115, 5/6 divider 120, 7/8 divider 125 and 9/10 divider 130. CLKINB is coupled to respective CLKINB inputs of 2 divider 110 and 3/4 divider 115 (when 3/4 divider 115 is of the type illustrated in FIG. 2A and described infra). There is no CLKINB input to 3/4 divider 115 is of the type illustrated in FIG. 2B and described infra. BIT1 of SELECT is coupled to respective CNTRL inputs of 3/4 divider 115, 5/6 divider 120, 7/8 divider 125 and 9/10 divider 130. The function of the EXT RESET signal is described infra.

A CLKOUT2 signal from 2 divider 110 is coupled to a first input of inverting multiplexer 135. CLKOUT2 has a frequency of half that of CLKIN. CLKOUT3 signal from 3/4 divider 115 is coupled to a second input of inverting multiplexer 135 and a CLKOUT4 signal from 3/4 divider 115 is coupled to a third input of inverting multiplexer 135. CLKOUT3 has a frequency of one third and CLKOUT4 has a frequency of one quarter the frequency of CLKIN. A CLKOUT5/6 signal from 5/6 divider 120 is coupled to a fourth input of inverting multiplexer 135. CLKOUT5/6 has a frequency of one fifth or one sixth that of CLKIN depending on whether BIT1 is a one or a zero. A CLKOUT7/8 signal from 7/8 divider 125 is coupled to a fifth input of inverting multiplexer 135. CLKOUT7/8 has a frequency of one seventh or one eighth that of CLKIN depending on whether BIT1 is a one or a zero. A CLKOUT9/10 signal from 9/10 divider 130 is coupled to a sixth input of inverting multiplexer 135. CLKOUT9/10 has a frequency of one ninth or one tenth that of CLKIN depending on whether BIT1 is a one or a zero.

Switching inputs of inverting multiplexer 135 are coupled to the SELECT signal. The output of inverting multiplexer 135, DIVCLK is either CLKOUT2, CLKOUT3, CLKOUT4, CLKOUT5/6, CLKOU7/8 or CLKOUT 9/10 based on the value of the bits in the SELECT signal. BIT1 also determines whether CLKOUT 5/6 is CLKIN divided by 5 or CLKIN divided by 6, whether CLKOUT7/8 is CLKIN divided by 7 or CLKIN divided by 8 and whether CLKOUT9/10 is CLKIN divided by 9 or CLKIN divided by 10. It should be understood that the output of 3/4 divider 115 is CLKOUT3 and CLKOUT4 when 3/4 divider 115 is of the first type, but the output of 3/4 divider 115 its output is a CLKOUT3/4 signal when 3/4 divider 115 is of the second type.

In one example, CLKIN has a frequency of about 4200 MHz or less and programmable frequency divider circuit 100 runs using a supply voltage (VCC) as low as about 1.15 volts. TABLE I illustrates the value of the frequency of DIVCLK as a function of the value of the frequency of CLKIN based on the values of the bits in the SELECT signal.

TABLE I

| BIT1 | BIT2 | BIT3 | BIT4 | DIVCLK |
|---|---|---|---|---|
| 0 | 1 | 1 | 0 | CLKIN/2 |
| 1 | 0 | 1 | 0 | CLKIN/3 |
| 0 | 0 | 1 | 0 | CLKIN/4 |
| 1 | 1 | 0 | 0 | CLKIN/5 |
| 0 | 1 | 0 | 0 | CLKIN/6 |
| 1 | 0 | 0 | 0 | CLKIN/7 |
| 0 | 0 | 0 | 0 | CLKIN/8 |
| 1 | 0 | 0 | 1 | CLKIN/9 |
| 0 | 0 | 0 | 1 | CLKIN/10 |

Figure 2A:
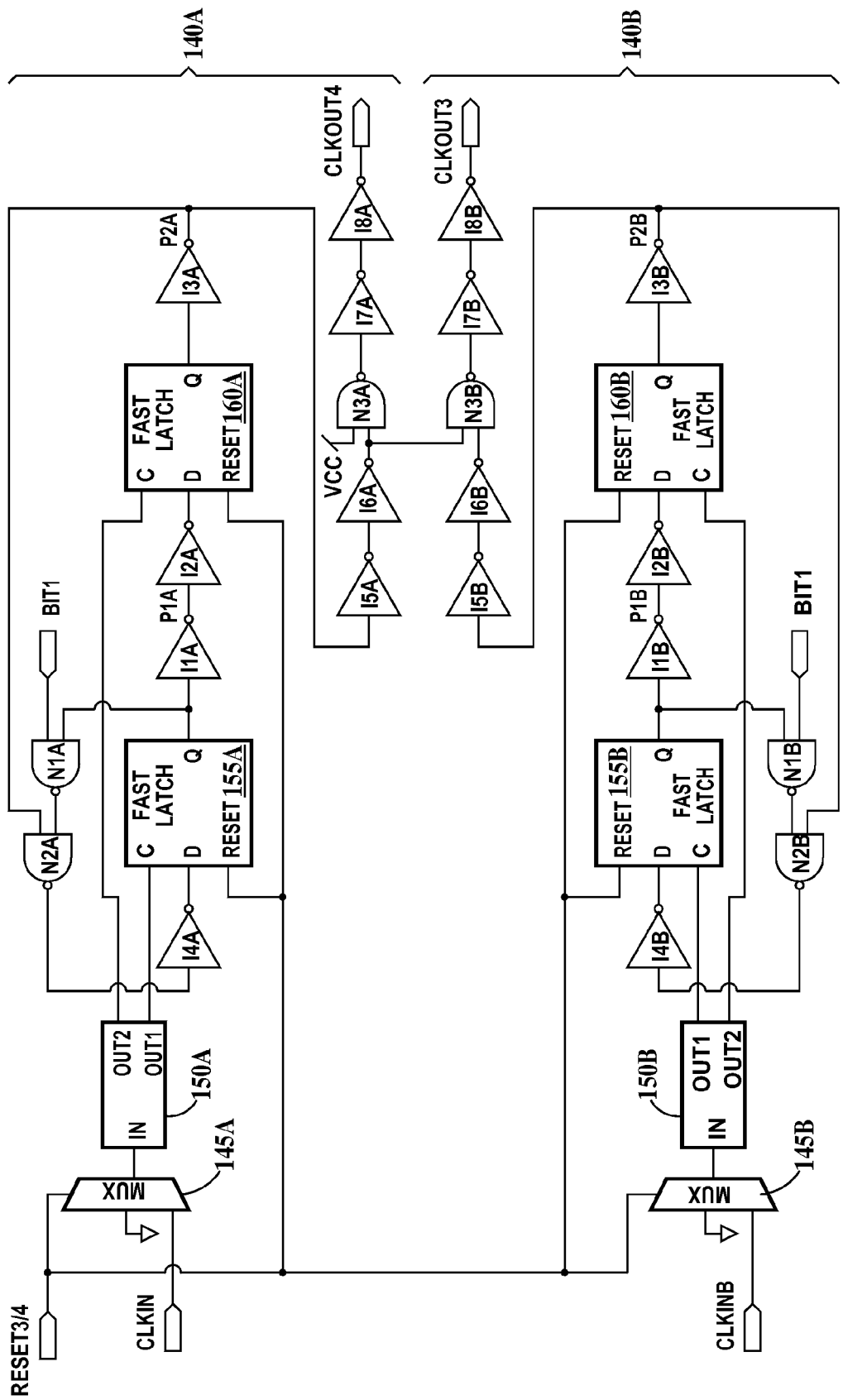
FIG. 2A is a schematic diagram of a first type divide by 3 or 4 frequency divider circuit according to embodiments of the present invention.
Figure 3:
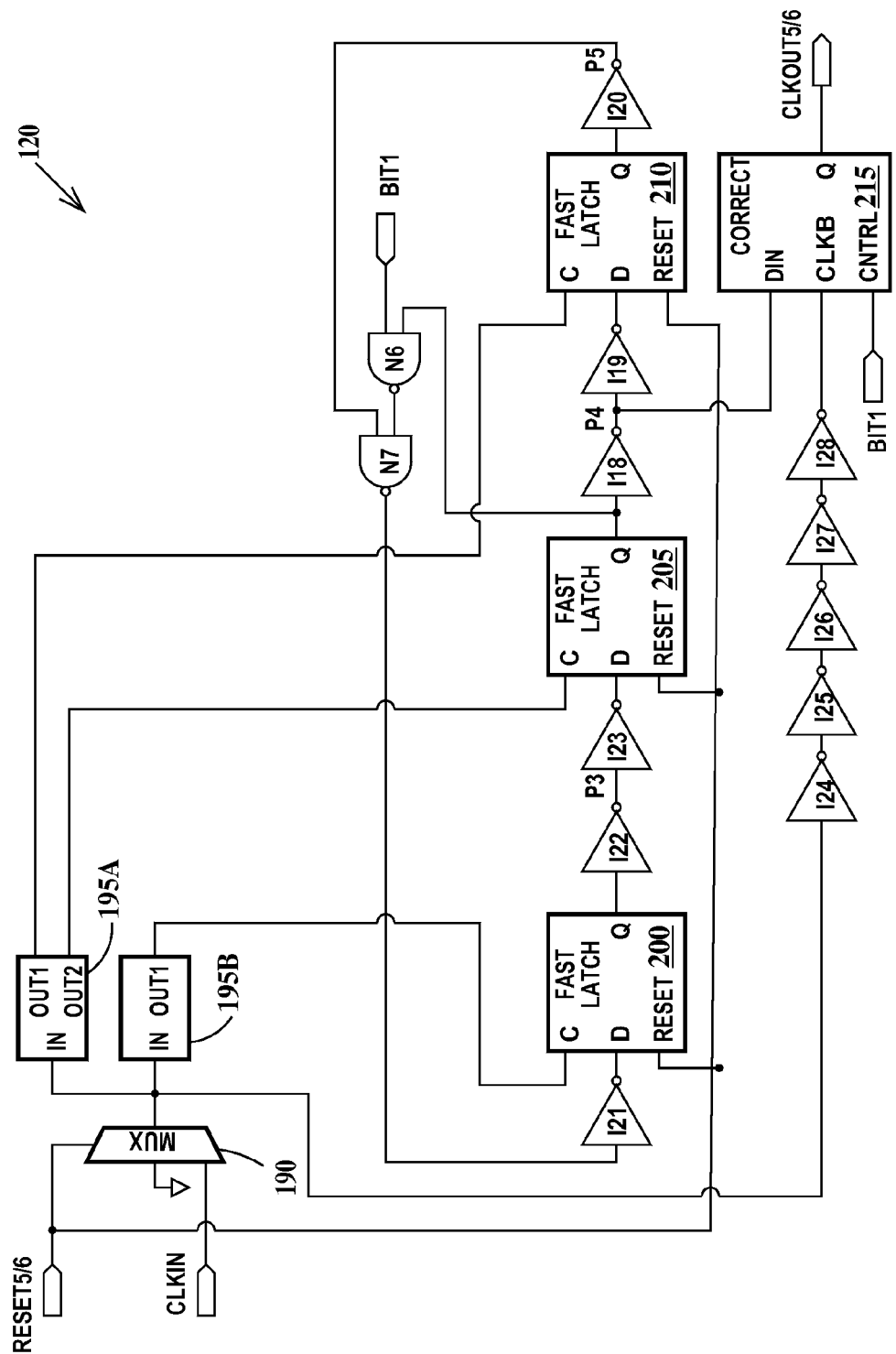
FIG. 3 is a schematic diagram of a divide by 5 or 6 frequency divider circuit according to embodiments of the present invention.

FIG. 2A is a schematic diagram of a first type divide by 3 or 4 frequency divider circuit according to the present invention. In FIG. 2A, 3/4 divider 115 is comprised of two interconnected similar circuits, a first section 140A and a second section 140B.

Figure 6A:
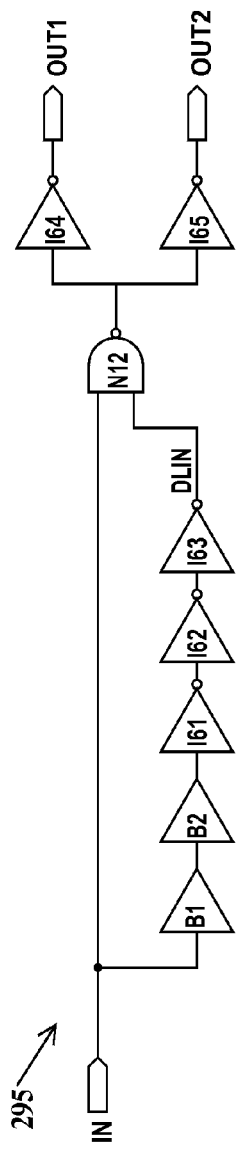
FIG. 6A is a schematic diagram of a one-shot pulse generator according to embodiments of the present invention.

First section 140A includes an inverting multiplexer 145A, a one-shot generator 150A and two fast latches 155A and 160A. The select input of inverting multiplexer 145A is coupled to RESET3/4, a first input of the inverting multiplexer is coupled to ground and a second input of the inverting multiplexer is coupled to CLKIN. When RESET3/4 is high, the output of inverting multiplexer 145A is high and CLKOUT4 is low saving power. When RESET3/4 is low, the output of inverting multiplexer 145A is inverted CLKIN. The output of inverting multiplexer 145A is coupled to the input of one-shot generator 150A which generates an OUT1 signal coupled to the clock (C) input of fast latch 155A and an OUT2 signal coupled to the C input of fast latch 160A. One-shot generator 150A is illustrated in FIG. 6A and OUT1 and OUT2 are identical signals illustrated in FIG. 6B and described infra. One-shot generator 150A has two outputs in order to increase drive. RESET is coupled to the RESET input of fast latches 155A and 160A. The output (Q) of fast latch 155A is coupled to the data (D) input of fast latch 160A through invertors I1A and I2A and to a first input of NAND gate N1A. The output of fast latch 160A is coupled to the input of inverter I3A. The output of inverter I3A is coupled to a first input of NAND gate N2A and to a first input of NAND gate N3A through series inverters I5A and I6A. BIT1 is coupled to a second input of NAND gate N1A and the output of NAND gate N1A is coupled to a second input of NAND gate N2A. The output of NAND gate N2A is coupled to the data input of fast latch 155A through inverter I4A. A second input of NAND gate N3A is coupled to VCC and the output of NAND gate N3A passed through series inverters I7A and I8A to generate CLKOUT4.

Second section 140B includes an inverting multiplexer 145B, a one-shot generator 150B and two fast latches 155B and 160B. The select input of inverting multiplexer 145B is coupled to RESET3/4, a first input of the inverting multiplexer is coupled to ground and a second input of the inverting multiplexer is coupled to CLKINB. When RESET3/4 is high, the output of inverting multiplexer 145B is high and CLKOUT3 is low saving power. When RESET3/4 is low, the output of inverting multiplexer 145B is inverted CLKINB. The output of inverting multiplexer 145B is coupled to the input of one-shot generator 150B which generates an OUT1 signal coupled to the C input of fast latch 155B and an OUT2 signal coupled to the C input of fast latch 160B. One-shot generator 150B is illustrated in FIG. 6A and OUT1 and OUT2 are identical signals illustrated in FIG. 6B and described infra. One-shot generator 150B has two outputs in order to increase drive. RESET is coupled to the RESET input of fast latches 155B and 160B. The output Q of fast latch 155B is coupled to the D input of fast latch 160B through inverters I1B and I2B and to a first input of NAND gate N1B. The output of fast latch 160B is coupled to the input of inverter I3B. The output of inverter I3B is coupled to a first input of NAND gate N2B and to a first input of NAND gate N3B through series inverters I5B and I6B. BIT1 is coupled to a second input of NAND gate N1B and the output of NAND gate NIB is coupled to a second input of NAND gate N2B. The output of NAND gate N2B is coupled to the data input of fast latch 155B through inverter I4B. A second input of NAND gate N3B is coupled to the output of inverter I6A and the output of NAND gate N3B passed through series inverters I7B and I8B to generate CLKOUT3.

Figure 7A:
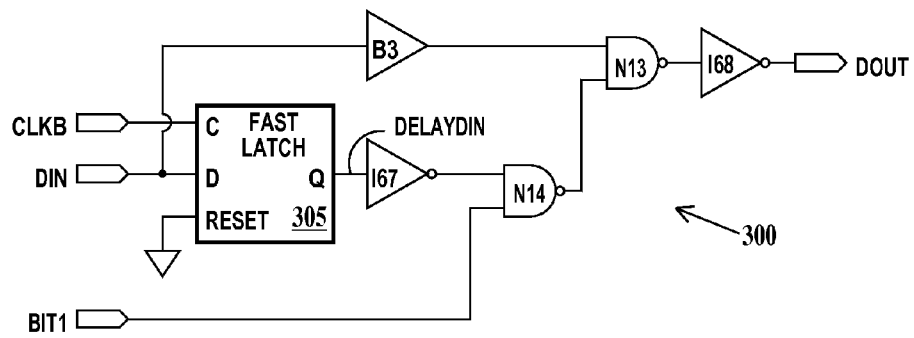
FIG. 7A is a schematic diagram of a clock duty cycle correction circuit according to embodiments of the present invention.
Figure 7B:
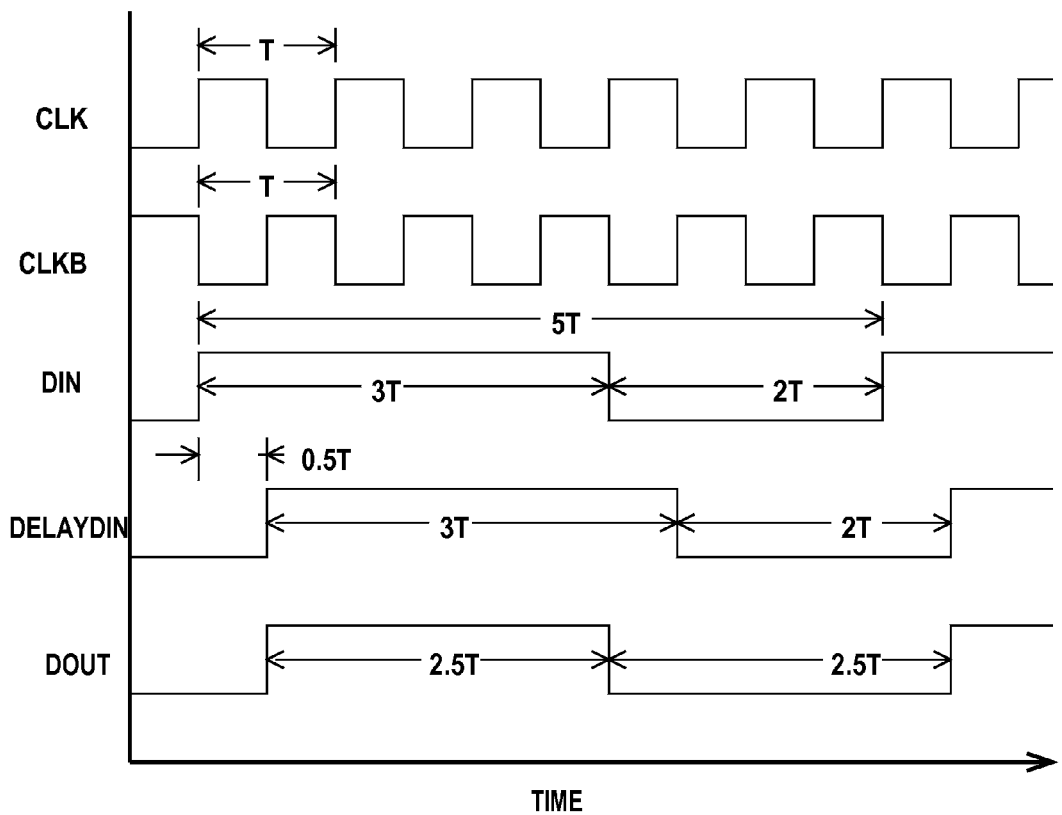
FIG. 7B is a timing diagram of the clock duty cycle correction circuit of FIG. 7A.

One-shot generator 150A generates a clock pulse of user defined length on the rising edge (transition from 0 to 1) of CLKIN and one shot generator 150B generates the same user defined length pulse on the rising edge of CLKINB which is the falling edge (transition from 1 to 0) of CLKIN. The pair of fast latches 155A and 160A (155B and 160B) connected as a shift register provide a divide by 3 or 4 depending on the value of BIT1. NAND gates N1A(B) and N2A(B) couple the output of fast latches 155A(B) and 160A(B) to the input of fast latch 155A(B). For a divide by 3, BIT1 is set to 1, causing NAND gates N1A(B) and N2A(B) to act as a NAND gate with a first input from P2A and a second input from P1A (NAND gate N1A(B) performs the function of inverter I1A(B)). For a divide by 4, BIT1 is set to 0 causing NAND gate N2A(B) to act as an inverter, inverting P2A(B). The two sections 140A and 140B latching on opposite edges of CLKIN provides automatic duty cycle correction via NAND gate N3B because P2A and P2B are shifted exactly half a cycle (of CLKIN) apart. Duty cycle correction is illustrated in FIG. 7B and described infra. Note, the separate CLKOUT3 and CLKOUT4 provide increased drive versus a shared CLK3/4 output which is important in high speed circuits. Insufficient drive or high current loading can slow a circuit down.

In TABLE II, there are only three combinations of logical states of nodes P1A/B and P2A/B when BIT1 is a 1 and four combinations of logical states when BIT1 is a 0. The states are presented in the sequence they appear as the shift register cycles. Only one cycle is shown. The number of different possible states corresponds to the amount by which the frequency of CLKIN is divided.

TABLE II

| State/Node | Divide by 3 | | Divide by 4 | |
|---|---|---|---|---|
| | P1A/B | P2A/B | P1A/B | P2A/B |
| 1 | 1 | 1 | 1 | 1 |
| 2 | 0 | 1 | 0 | 1 |
| 3 | 1 | 0 | 0 | 0 |
| 4 | | | 1 | 1 |

Figure 2B:
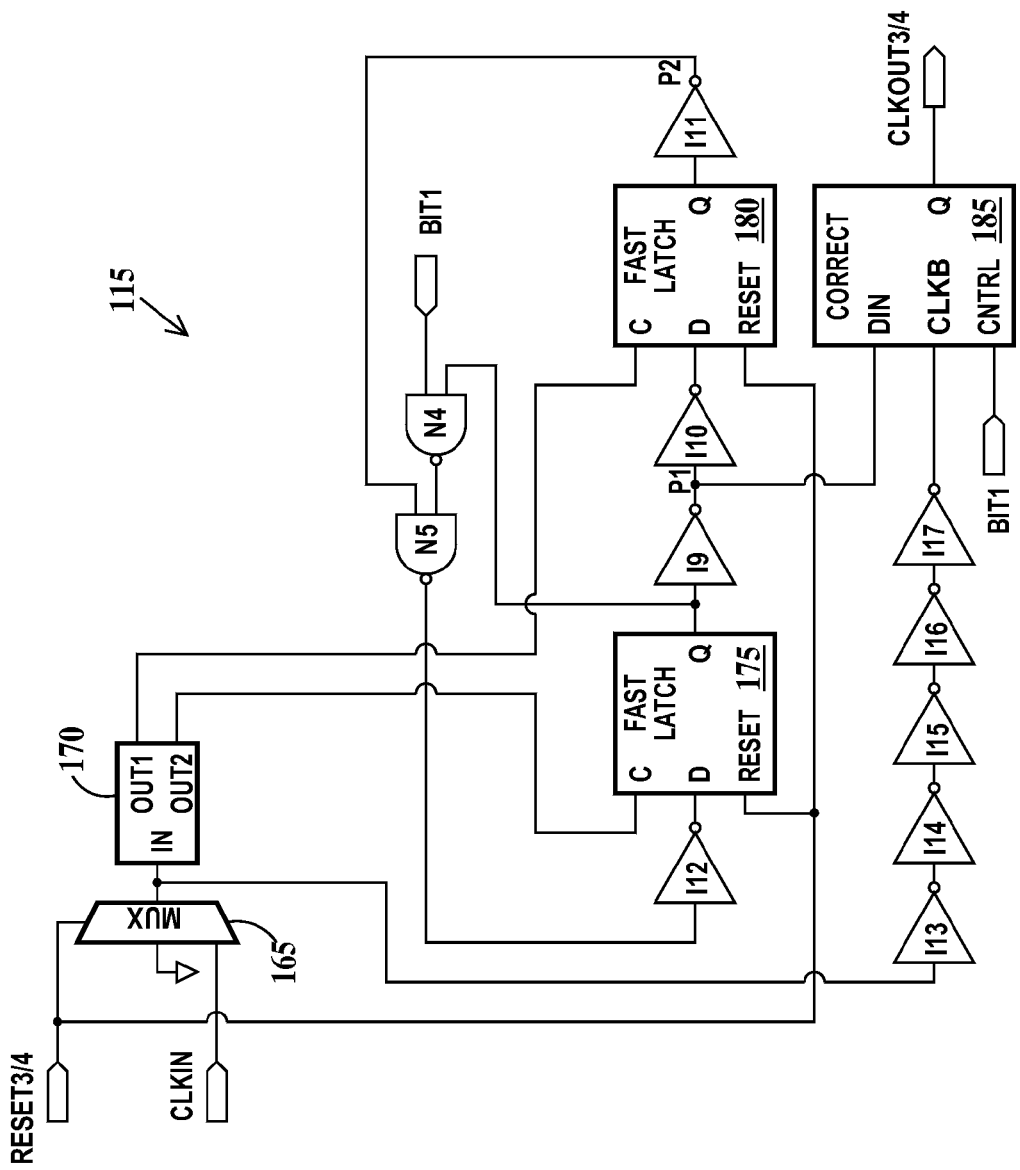
FIG. 2B is a schematic diagram of a second type divide by 3 or 4 frequency divider circuit according to embodiments of the present invention.
Figure 6B:
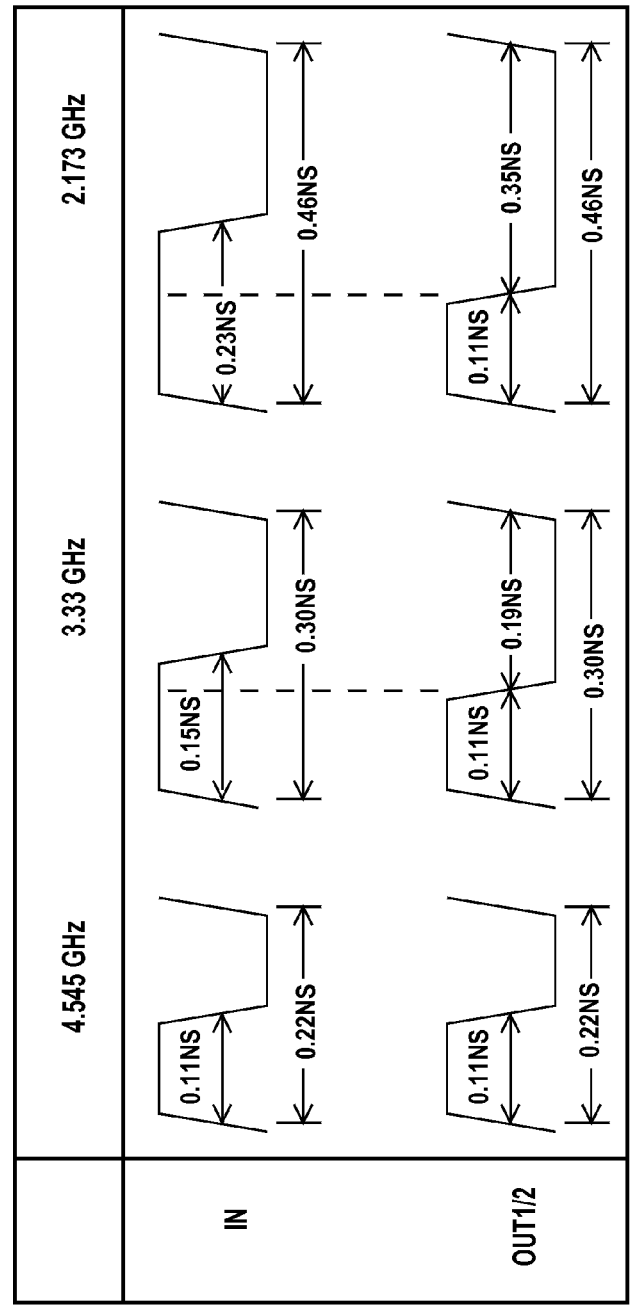
FIG. 6B is a timing diagram of the one-shot generator of FIG. 6A.

FIG. 2B is a schematic diagram of a second type divide by 3 or 4 frequency divider circuit according to the present invention. In FIG. 2B, 3/4 divider 115 includes an inverting multiplexer 165, a one-shot generator 170, two fast latches 175 and 180 and a duty cycle correction circuit 185. The select input of inverting multiplexer 165 is coupled to RESET3/4, a first input of the inverting multiplexer is coupled to ground and a second input of the inverting multiplexer is coupled to CLKIN. When RESET3/4 is high, the output of inverting multiplexer 165 is high and CLK-OUT3/4 is low saving power. When RESET3/4 is low, the output of inverting multiplexer 165 is inverted CLKIN. The output of inverting multiplexer 165 is coupled to the input of one-shot generator 170 which generates an OUT1 signal coupled to the C input of fast latch 175 and an OUT2 signal coupled to the C input of fast latch 180. One-shot generator 170 is illustrated in FIG. 6A and OUT1 and OUT2 are identical signals illustrated in FIG. 6B and described infra. One-shot generator 170 has two outputs in order to increase drive. RESET is coupled to the RESET input of fast latches 175 and 180. The output Q of fast latch 175 is coupled to the D input of fast latch 180 through invertors I9 and I10 and to a first input of NAND gate N4. The output of fast latch 180 is coupled to the input of inverter I11. The output of inverter I11 is coupled to a first input of NAND gate N5. BIT1 is coupled to a second input of NAND gate N4 and the output of NAND gate N4 is coupled to a second input of NAND gate N5. The output of NAND gate N5 is coupled to the data input of fast latch 175 through inverter I12. The output of inverting multiplexer 165 is coupled to a CLKB input of duty cycle correction circuit 185 through series inverters I13, I14, I15, I16 and I17. A DIN input of duty cycle correction circuit 185 is coupled between the output of inverter I9 and the input of inverter I10. BIT1 is coupled to a CNTRL input of duty cycle correction circuit 185. The output of duty cycle correction circuit 185 is CLKOUT3/4. Duty cycle correction cycle is illustrated in FIG. 7A and described below.

One-shot generator 150A generates a clock pulse of user defined length on the rising edge (transition from 0 to 1) of CLKIN. The pair of fast latches 175 and 180 connected as a shift register provide a divide by 3 or 4 depending on the value of BIT1. NAND gates N4 and N5 couple the outputs of fast latches 175 and 180 to the input of fast latch 175. For a divide by 3, BIT1 is set to 1, causing NAND gates N4 and N5 to act as a NAND gate with a first input from P2 and a second input from P1 (NAND gate N4 performs the function of inverter I9). For a divide by 4, BIT1 is set to 0, causing NAND gate N5 to act as an inverter, inverting P2. Since duty cycle correction is only required on odd divisions of frequency (i. e. by 3, 5, 7, 9) when BIT1=1 duty cycle correction circuit 185 is in correction mode and when BIT1=0 duty cycle correction circuit 185 is in bypass mode.

FIG. 3 is a schematic diagram of a divide by 5 or 6 frequency divider circuit according to the present invention. In FIG. 3, 5/6 divider 120 includes an inverting multiplexer 190, two one-shot generators 195A and 195B, three fast latches 200, 205 and 210 arranged as a shift register and a duty cycle correction circuit 215. The select input of inverting multiplexer 190 is coupled to RESET5/6, a first input of the inverting multiplexer is coupled to ground and a second input of the inverting multiplexer is coupled to CLKIN. When RESET5/6 is high, the output of inverting multiplexer 190 is high and CLKOUT5/6 is low saving power. When RESET5/6 is low, the output of inverting multiplexer 190 is inverted CLKIN. Note duty cycle correction circuit 215 is coupled between fast latch 205 and fast latch 210, which are the last two latches of the shift register comprised of fast latches 200, 205 and 210. While two one-shot generators are illustrated, (for increased drive) one to three could be used. It will be noticed that 5/6 divider 120 is a homologue of 3/4 divider 115 of FIG. 2A in that an additional, third fast latch has been added to the shift register with appropriate additional one-shot generator circuitry.

One-shot generators 195A and 195B generate a clock pulse of user defined length on the rising edge (transition from 0 to 1) of CLKIN. The three fast latches 200, 205 and 210 connected as a shift register provide a divide by 5 or 6 depending on the value of BIT1. NAND gates N6 and N7 couple the output of fast latches 205 and 210 to the input of fast latch 200. For a divide by 5, BIT1 is set to 1, causing NAND gates N6 and N7 act as a NAND gate with a first input from P5 and a second input from P4 (NAND gate N6 performs the function of inverter I18). For a divide by 6, BIT1 is set to 0, causing NAND gate N7 to act as an inverter, inverting P5. Since duty cycle correction is only required on odd divisions of frequency when BIT1=1 duty cycle correction circuit 215 is in correction mode and when BIT1=0 duty cycle correction circuit 215 is in bypass mode.

In TABLE III, there are only five combinations of logical states of nodes P3, P4 and P5 when BIT1 is a 1 and six combinations of logical states of nodes P3, P4 and P5 when BIT1 is a 0. The states are presented in the sequence they appear as the shift register cycles. Only one cycle is shown. The number of different possible states corresponds to the amount by which the frequency of CLKIN is divided.

TABLE III

| | Divide by 5 | | | Divide by 6 | | |
|---|---|---|---|---|---|---|
| State/Node | P3 | P4 | P5 | P3 | P4 | P5 |
| 1 | 1 | 1 | 1 | 1 | 1 | 1 |
| 2 | 0 | 1 | 1 | 0 | 1 | 1 |
| 3 | 0 | 0 | 1 | 0 | 0 | 1 |
| 4 | 1 | 0 | 0 | 0 | 0 | 0 |
| 5 | 1 | 1 | 0 | 1 | 0 | 0 |
| 6 | | | | 1 | 1 | 0 |

Figure 4:
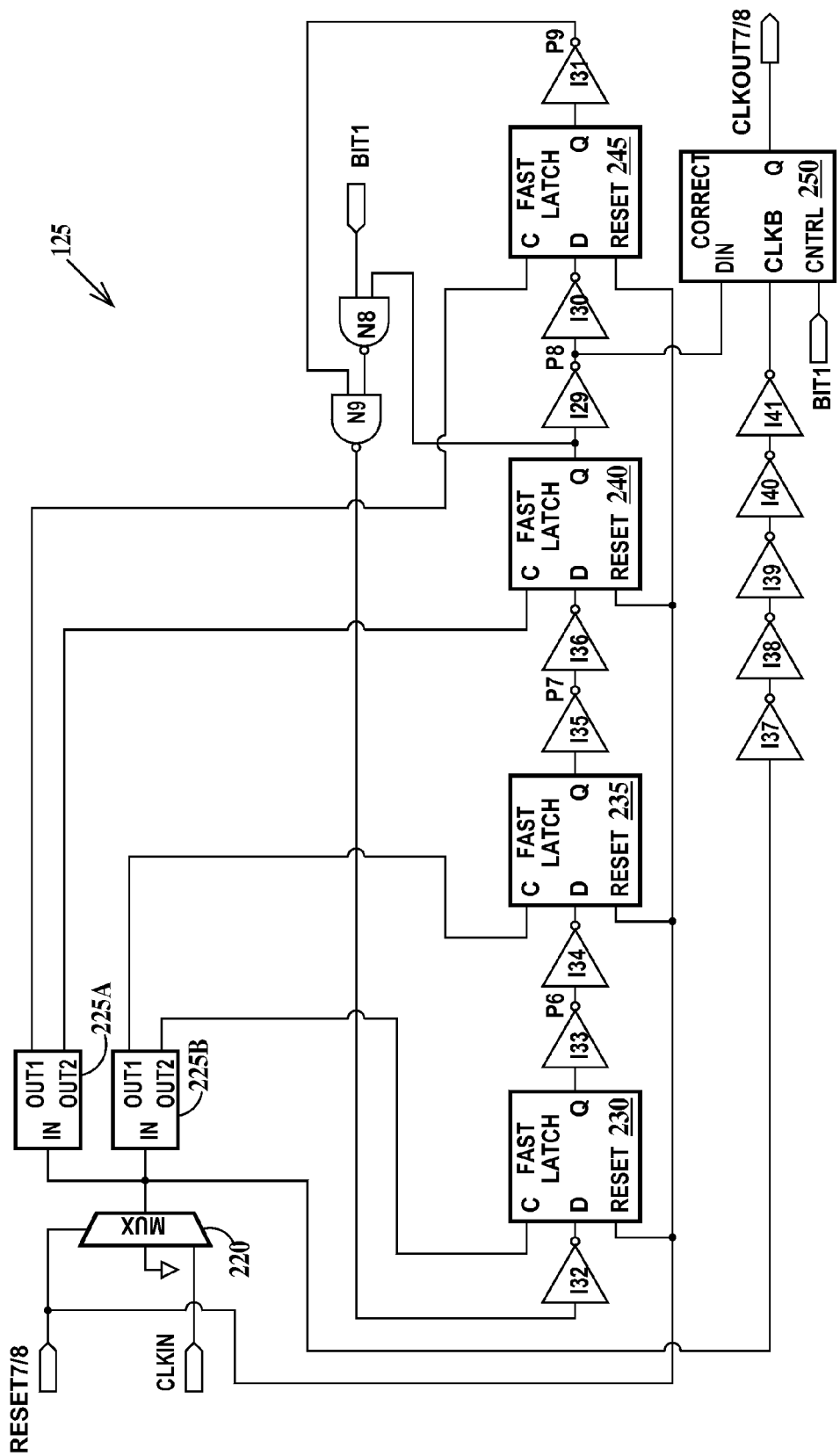
FIG. 4 is a schematic diagram of a divide by 7 or 8 frequency divider circuit according to embodiments of the present invention.

FIG. 4 is a schematic diagram of a divide by 7 or 8 frequency divider circuit according to the invention. In FIG. 4, 7/8 divider 125 includes an inverting multiplexer 220, two one-shot generators 225A and 225B, four fast latches 230, 235, 240 and 245 arranged as a shift register and a duty cycle correction circuit 250. The select input of inverting multiplexer 220 is coupled to RESET7/8, a first input of the inverting multiplexer is coupled to ground and a second input of the inverting multiplexer is coupled to CLKIN. When RESET7/8 is high, the output of inverting multiplexer 220 is high and CLKOUT7/8 is low saving power. When RESET7/8 is low, the output of inverting multiplexer 190 is inverted CLKIN. Note duty cycle correction circuit 250 is coupled between fast latch 240 and fast latch 245, which are the last two latches of the shift register comprised of fast latches 230, 235, 240 and 245. While two one-shot generators are illustrated, (for increased drive) one to four could be used. It will be noticed that 7/8 divider 125 is a homologue of 5/6 divider circuit of FIG. 3 in that an additional, fourth fast latch has been added to the shift register with appropriate additional one-shot generator circuitry.

One-shot generators 225A and 225B generate a clock pulse of user defined length on the rising edge (transition from 0 to 1) of CLKIN. The four fast latches 230, 235, 240 and 245 connected as a shift register provide a divide by 7 or 8 depending upon the value of BIT1. NAND gates N8 and N9 couple the output of fast latches 240 and 245 to the input of fast latch 230. For a divide by 7, BIT1 is set to 1, causing NAND gates N8 and N9 act as a NAND gate with a first input from P9 and a second input from P8 (NAND gate N8 performs the function of inverter I29). For a divide by 4, BIT1 is set to 0, causing NAND gate N9 to act as an inverter, inverting P9. Since duty cycle correction is only required on odd divisions of frequency when BIT1=1 duty cycle correction circuit 250 is in correction mode and when BIT1=0 duty cycle correction circuit 250 is in bypass mode.

In TABLE IV, there are only seven combinations of logical states of nodes P6, P7, P8 and P9 when BIT1=1 and eight combinations of logical states of nodes P6, P7, P8 and P9 when BIT1=0. The states are presented in the sequence they appear as the shift register cycles. Only one cycle is shown. The number of different possible states corresponds to the amount by which the frequency of CLKIN is divided.

TABLE IV

| | Divide by 7 | | | | Divide by 8 | | | |
|---|---|---|---|---|---|---|---|---|
| State/Node | P6 | P7 | P8 | P9 | P6 | P7 | P8 | P9 |
| 1 | 1 | 1 | 1 | 1 | 1 | 1 | 1 | 1 |
| 2 | 0 | 1 | 1 | 1 | 0 | 1 | 1 | 1 |
| 3 | 0 | 0 | 1 | 1 | 0 | 0 | 1 | 1 |
| 4 | 0 | 0 | 0 | 1 | 0 | 0 | 0 | 1 |
| 5 | 1 | 0 | 0 | 0 | 0 | 0 | 0 | 0 |
| 6 | 1 | 1 | 0 | 0 | 1 | 0 | 0 | 0 |
| 7 | 1 | 1 | 1 | 0 | 1 | 1 | 0 | 0 |
| 8 | | | | | 1 | 1 | 1 | 0 |

Figure 5:
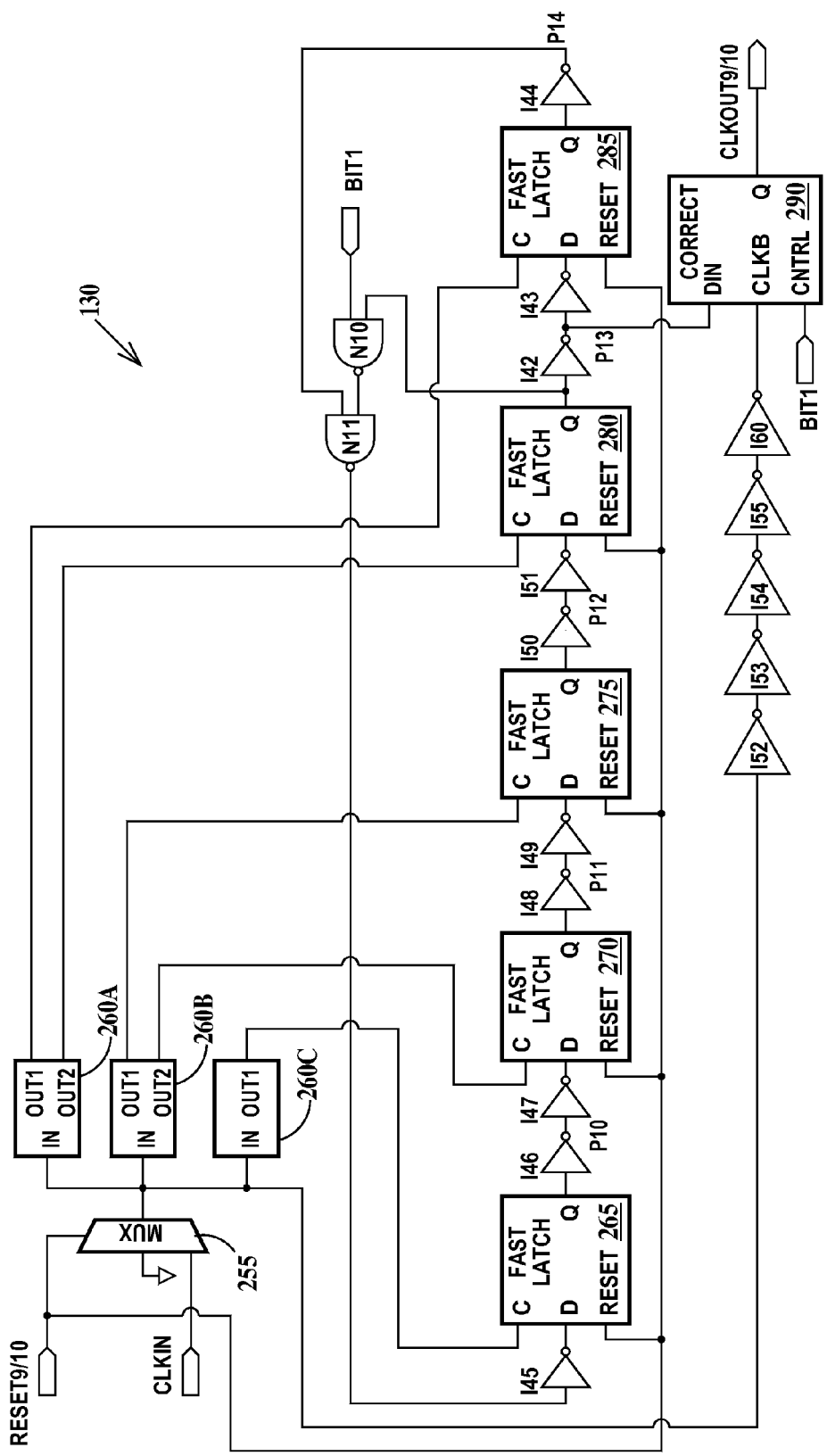
FIG. 5 is a schematic diagram of a divide by 9 or 10 frequency divider circuit according to embodiments of the present invention.

FIG. 5 is a schematic diagram of a divide by 9 or 10 frequency divider circuit according to the present invention. In FIG. 5, 9/10 divider 130 includes an inverting multiplexer 255, three one-shot generators 260A, 260B and 260C, five fast latches 265, 270, 275, 280 and 285 arranged as a shift register and a duty cycle correction circuit 290. The select input of inverting multiplexer 255 is coupled to RESET9/10, a first input of the inverting multiplexer is coupled to ground and a second input of the inverting multiplexer is coupled to CLKIN. When RESET9/10 is high, the output of inverting multiplexer 255 is high and CLKOUT9/10 is low saving power. When RESET9/10 is low, the output of inverting multiplexer 255 is inverted CLKIN. Note duty cycle correction circuit 290 is coupled between fast latch 280 and fast latch 285, which are the last two latches of the shift register comprised of fast latches 265, 270, 275, 280 and 285. While three one-shot generators are illustrated, (for increased drive) one to five could be used. It will be noticed that 9/10 divider 130 is a homologue of 7/8 divider circuit of FIG. 4 in that an additional, fifth fast latch has been added to the shift register with appropriate additional one-shot generator circuitry.

One-shot generators 260A, 260B and 260C generate a clock pulse of user defined length on the rising edge (transition from 0 to 1) of CLKIN. The five fast latches 265, 270, 275, 280 and 285 connected as a shift register provide a divide by 9 or 10 depending upon the value of BIT1. The four fast latches 230, 235, 240 and 245 connected as a shift register provide a divide by 9 or 10 depending upon the value of BIT1. NAND gates N10 and N11 couple the output of fast latches 280 and 285 to the input of fast latch 265. For a divide by 9, BIT1 is set to 1, causing NAND gates N10 and N11 act as a NAND gate with a first input from P14 and a second input from P13 (NAND gate N10 performs the function of inverter I42). For a divide by 4, BIT1 is set to 0 causing NAND gate N11 to act as an inverter, inverting P14. Since duty cycle correction is only required on odd divisions of frequency when BIT1=1 duty cycle correction circuit 290 is in correction mode and when BIT1=0 duty cycle correction circuit 290 is in bypass mode.

In TABLE V, there are only seven combinations of logical states of nodes P10, P11, P12, P13 and P14 when BIT1=1 and eight combinations of logical states of nodes P10, P11, P12, P13 and P14 when BIT1=0. The states are presented in the sequence they appear as the shift register cycles. Only one cycle is shown. The number of different possible states corresponds to the amount by which the frequency of CLKIN is divided.

TABLE V

| State/Node | Divide by 9 | | | | | Divide by 10 | | | | |
|---|---|---|---|---|---|---|---|---|---|---|
| | P10 | P11 | P12 | P13 | P14 | P10 | p11 | P12 | P13 | P14 |
| 1 | 1 | 1 | 1 | 1 | 1 | 1 | 1 | 1 | 1 | 1 |
| 2 | 0 | 1 | 1 | 1 | 1 | 0 | 1 | 1 | 1 | 1 |
| 3 | 0 | 0 | 1 | 1 | 1 | 0 | 0 | 1 | 1 | 1 |
| 4 | 0 | 0 | 0 | 1 | 1 | 0 | 0 | 0 | 1 | 1 |
| 5 | 0 | 0 | 0 | 0 | 1 | 0 | 0 | 0 | 0 | 1 |
| 6 | 1 | 0 | 0 | 0 | 0 | 0 | 0 | 0 | 0 | 0 |
| 7 | 1 | 1 | 0 | 0 | 0 | 1 | 0 | 0 | 0 | 0 |
| 8 | 1 | 1 | 1 | 0 | 0 | 1 | 1 | 0 | 0 | 0 |
| 9 | 1 | 1 | 1 | 1 | 0 | 1 | 1 | 1 | 0 | 0 |
| 10 | | | | | | 1 | 1 | 1 | 1 | 0 |

FIG. 6A is a schematic diagram of a one-shot generator 295 according to the present invention. One-shot generator 295 is exemplary of one-shot generators 150A and 150B of FIG. 2A, one-shot generator 170B of FIG. 2B, one-shot generators 195A and 195B of FIG. 3, one-shot generators 225A and 225B of FIG. 4, and one-shot generators 260A, 260B and 260C of FIG. 5. A first input a NAND gate N12 is coupled to an IN signal (which in the present invention is CLKIN or CLKINB in the case of one-shot generator 150B of FIG. 2A) and to the input of buffer B1. The output of buffer B1 is coupled to the input of buffer B2. The output of buffer B2 is coupled to the input of inverter I61. The output of inverter I61 is to the input of inverter I62. The output of inverter I62 is coupled to the input of inverter I63. The output of inverter I63 is coupled to a second input of NAND gate N12. The output of NAND gate N12 is coupled to the inputs of inverters I64 and I65. The outputs of inverters I64 and I65 are signals OUT1 and OUT2 respectively.

The propagation delay through buffers B1 and B2 and inverters I61, I62 and I63 is chosen such that OUT1 and OUT2 have a 50% duty cycle at a maximum frequency of MAXFREQ. MAXFREQ is defined as about 5 to 15% higher than the maximum allowable frequency of CLKIN (CLKINMAQXFREQ) and is defined by equation 1:

$$MAXFREQ = CLKINMAXFREQ + WINDOW (CLKINMAXFREQ) \quad (1)$$

where:

MAXFREQ=maximum frequency of the one-shot generator;

CLKINMAXFREQ=maximum frequency divider circuits can operate on; and

WINDOW=5 to 15%.

OUT1 and OUT2 will always have a high signal time duration equal to that of the high signal time duration of a clock at MAXFREQ but the low signal time duration of OUT1 and OUT 2 will be greater than the low signal time duration of a clock signal at MAXFREQ. This is illustrated in FIG. 6B. The difference in frequency between MAXFREQ and CLKINMAXFREQ is purposeful and prevents data just shifted into a fast latch to be shifted again into the following latch on the same clock cycle of any of the frequency divider circuits described supra.

FIG. 6B is a timing diagram of the one-shot generator of FIG. 6A. Each cycle of a CLKIN signal at MAXFREQ=4.545 GHz will have a high signal time duration of 0.11 ns and a low signal time duration of 0.11 ns and OUT1 and OUT2 will have a high signal time durations of 0.11 ns and low signal time durations of 0.11 ns. One cycle of a CLKIN signal at a frequency=3.33 GHz will have a high signal time duration of 0.15 ns and a low signal time duration of 0.15 ns and OUT1 and OUT2 will have high signal time durations of 0.11 ns and low signal time durations of 0.19 ns. Each cycle of a CLKIN signal at a frequency=2.173 GHz will have a high signal time duration of 0.23 ns and a low signal time duration of 0.23 ns and OUT1 and OUT2 will have high signal time durations of 0.11 ns and a low signal time duration of 0.35 ns. Thus, one-shot generator 295 provides a clock signal with a constant high time, which is independent of the high time of CLKIN. It should be remembered that OUT1 and OUT2 are the clock inputs to the fast latches of the divider circuits described supra and those latches switch on the rising clock edge as described infra in relation to FIG. 8. In one example, MAXFRQ is about 4.545 GHz, corresponding to a time-period of 0.22 ns. Assuming a 50% duty cycle, the on time is 0.11 ns. 0.11 ns is a short enough clock on time just sufficient to transfer data from the input of a fast latch to the output of the fast latch yet prevent data just shifted into a fast latch to be shifted again into the following fast latch on the same CLKIN (or CLKINB) clock cycle in the frequency divider circuits described supra.

FIG. 7A is a schematic diagram of a clock duty cycle correction circuit 300 according to the present invention. Duty cycle correction circuit 300 is exemplary of duty cycle correction circuits 185 of FIG. 2B, 215 of FIG. 3, 250 of FIG. 4 and 290 of FIG. 5. In FIG. 7A, clock duty cycle circuit 300 includes a fast latch 305, buffer B3, inverters I67 and I68 and NAND gates N13 and N14. CLKB is coupled to the C input of fast latch 305. DIN (from a node of a shift register of divider circuits described supra) is coupled to the D input of fast latch 305 and to the input of buffer B3. The reset of fast latch 305 is coupled to ground and the output of fast latch 305 is coupled to the input of inverter I67. BIT1 is coupled to a first input of NAND gate N14 and the output of inverter I67 is coupled to a second input of NAND gate N14. The output of NAND gate N14 is coupled to a first input of NAND gate N13 and the output of inverter I66 is coupled to a second input of NAND gate N13. The output of NAND gate N13 is coupled to the input of inverter I68. The output of inverter I68 is DOUT, which is a duty cycle corrected version of DIN.

BIT1 applied to NAND gate N14 prevents duty cycle correction being performed on even divisions of frequency (see TABLE 1 supra).

FIG. 7B is a timing diagram of the clock duty cycle correction circuit of FIG. 7A. FIG. 7A utilizes the operation of 5/6 divider 120 of FIG. 3 to illustrate duty cycle correction for a divide by 5 operation. In FIG. 7B, CLK and CLKB have a cycle time of T, DIN has a cycle time of 5T but is high for a time of 3T and low for a time of 2T, a 60% duty cycle). This may also may be seen by referring to the P4 node column under Divide by 5 of TABLE III which is 11001 (11100) where each one represents a high DIN signal for one CLKIN cycle T and each 0 represents a low DIN signal for one CLKIN cycle T. DELAYDIN is shifted one half CLKIN time cycle (T/2) from DIN. Buffer 166 has the same delay as the total delay through fast latch 305, inverter I67 and NAND gate N14 so that the output of NAND gate N14 and the output of buffer I66 are half a clock CLKIN cycle apart (T/2) apart. DOUT, which is the result of NAND gate N13 of FIG. 7A has a signal high time of 2.5T and a signal low time of 2.5T, and thus a 50% duty cycle. That no correction is needed for a divide by 6 may also be seen by referring to the P4 node column under Divide by 5 of TABLE III, which is 110001 (111000).

FIG. 8 is a schematic diagram of a fast latch 310 according to the present invention. Fast latch 310 is exemplary of fast latches 155A, 155B, 160A and 160B of FIG. 2A, of fast latches 175 and 180 of FIG. 2B, of fast latches 200, 205 and 210 of FIG. 3, of fast latches 230, 235, 240, and 245 of FIG. 4, of fast latches 265, 270, 275, 280 and 285 of FIG. 5 and of fast latch 305 of FIG. 7A. Fast latch 310 includes a NAND gate 315 comprised of PFETs (P-channel field effect transistor) T1 and T4 and NFETs (N-channel field effect transistor) T2, T3, T5 and T6, an N-clocked inverter 320 comprised of PFET T7 and NFETs T8 and T9, a first inverter 325 comprised of a PFET T10 and an NFET T11 and a second inverter 330 comprised of a PFET T12 and an NFET T13. First inverter also includes a reset PFET.

The sources of PFETS T1, T4, T7, T10 and T12 are coupled to VCC and the sources of NFETs T3, T6, T9 and T13 and the drain of NFET T14 are coupled to ground. The gates of PFET T1 and NFETs T2, T5 and T8 are coupled to the C (clock) input of fast latch 310. The gates of PFET T4 and NFETs T3 and T6 are coupled to the D (data) input of fast latch 310. The drains of PFETs T1 and T4 and NFETs T2 and T5 and the gates of PFET T7 and NFET T9 are coupled to a node P15. The source of NFET T8 is coupled to the drain of NFET T9. The drains of PFET T7 and NFET T8, the source of PFET T14 and the gates of PFET T10 and NFET T11 are coupled to a node P16. The drains of PFET T10 and NFET T11 and the gates of PFET T12 and NFET T13 are coupled to a node P17. The drains of PFET T12 and NFET T13 are coupled to the output (Q) of fast latch 310. RESET is coupled to the gate of NFET T14 through serially coupled inverters I69 and I70.

In operation, a high on RESET turns on NFET T14 bringing node P16 to ground, turning PFET T10 on bringing node P17 high and turning NFET T13 on bringing Q low. When C is low, PFET T1 turns on precharging node P15 high and PFET T7 and NFET T8 turns off, isolating node P16 and preserving the state of node P16. When C is high a high or low on D will influence the state of node P15. Node P15 will assume the state corresponding to the inverse of D.

If, with C high, D is high NFETs T3 and T6 turn on, PFET T4 turns off and, node P15 is pulled low. With C high, PFET T7 turns on, NFET T9 turns off and node P16 is pulled high. A high on node P16 turns on NFET T11 and turns off PFET T10 bringing node P17 low. A low on node P17 turns on PFET T12 and turns off NFET T13 bringing Q high.

If, with C high, D is low NFETs T3 and T6 turn off, PFET T4 turns on and, node P15 is remains high (the precharge state). With C high, NFET T9 turns on, PFET T7 turns off and node P16 is pulled low. A low on node P16 turns on PFET T10 and turns off NFET 11 bringing node P17 high. A high on node P17 turns on NFET T13 and turns off PFET T12 bringing Q low.

With C high NFET T8 turns on and node P16 is determined by the state of node P15, a high on node P15 turning on NFET T9 and turning off PFET T7 bringing node P16 low and a low on node P15 turning off NFET T9 and turning on PFET T7 bringing node P16 high. Thus, the state of node P15 (determined by the state of D) is only transferred to node P16 when C is high. Since node P15 is precharge high, transfer of high from P15 to P16 is very fast. It should be remembered that the pulse width of C in the frequency divider circuits described supra is user defined and it is this width that determines when data transfer between nodes P15 and P16 can take place. The latch capture time is defined by equation 2:

$$LCT=1/(2(CLKINMAXFREQ)) \qquad (2)$$

where:

LCT is the latch capture time;

CLKINMAXFREQ=maximum frequency divider circuits can operate on.

Figure 9:
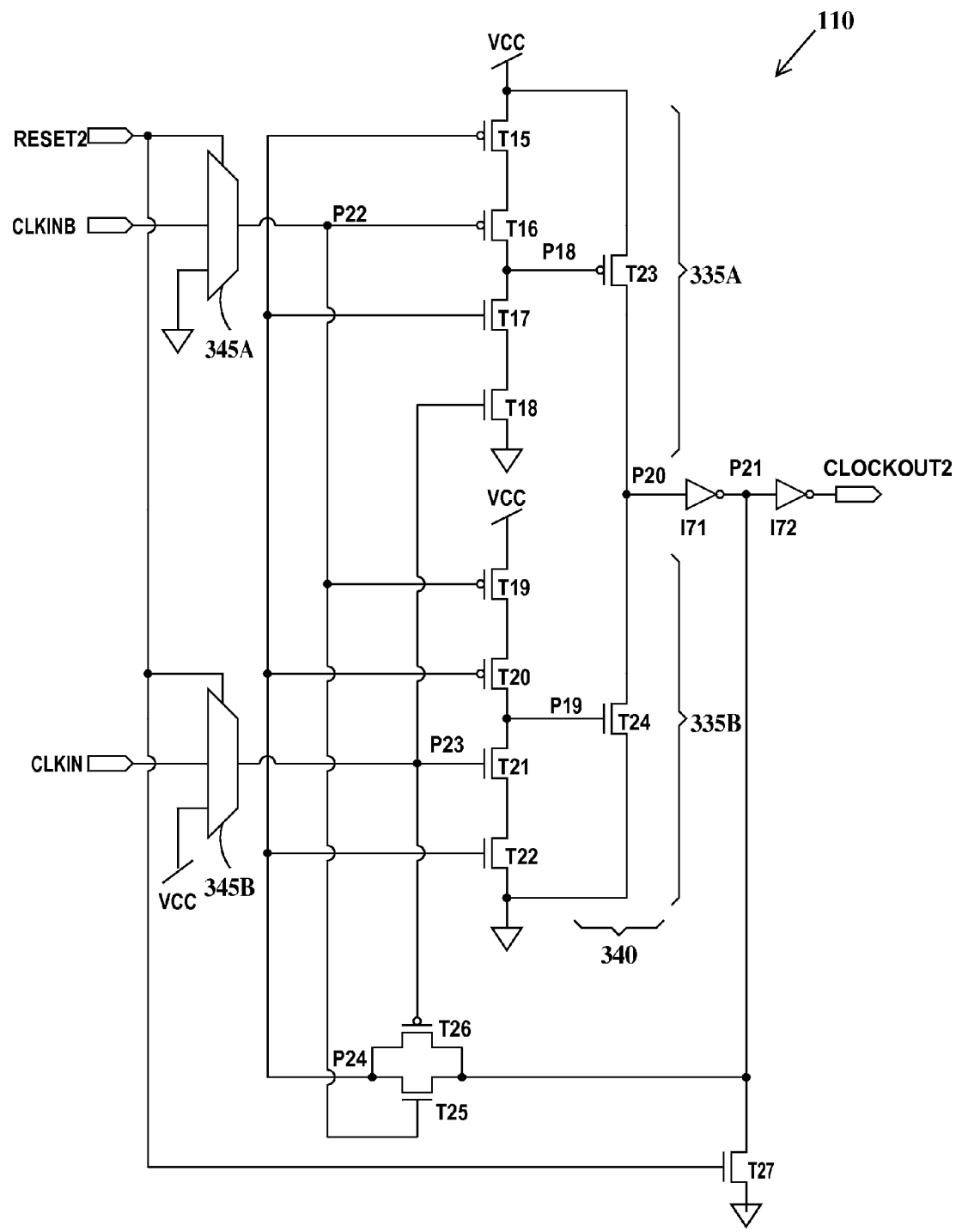
FIG. 9 is a schematic diagram of a frequency a divide by 2 frequency divider circuit according to embodiments of the present invention.

FIG. 9 is a schematic diagram of a frequency divide by 2 frequency divider circuit according to the present invention. This frequency divider does not utilize fast latches as described supra and is not a homologue of the divider circuits presented supra. In FIG. 9, 2 divider 110 includes a first transistor cascade 335A comprising PFETs T15 and T16 and NFETs T17 and T18 cascaded between power supply VCC and ground and a second transistor cascade 335B comprising PFETs T19 and T20 and NFETs T21 and T22 cascaded between VCC and ground; the source of PFET T15 (T19) coupled to VCC, the drain of PFET T15 (T19) coupled to the source of PFET T16 (T20), the drain of PFET T16 (T20) coupled to the drain of NFET T17 (T21) which is node P18 (P19), the source of NFET T17 (T21) coupled to the drain of NFET T18 (T22) and the source of NFET T17 (T22) coupled to ground. A PFET T23 and an NFET T24 form an inverter 340, the source of PFET T23 coupled to VCC, the drain of PFET T23 coupled to the drain of NFET T24 which is node P20, the source of NFET T24 coupled to ground, the gate of PFET T23 coupled to node P18 and the gate of NFET T24 coupled to node P19. An inverter I71 is coupled between node P20 and a node P21. An inverter I72 is coupled between node P21 and the CLKOUT2 output of 2 divider 110.

In FIG. 9, 2 divider 110 also includes a first inverting multiplexer 345A and a second inverting multiplexer 345B. The select input of inverting multiplexer 345A (345B) is coupled to RESET2, a first input of the inverting multiplexer is coupled to ground (VCC) and a second input of the inverting multiplexer is coupled to CLKINB (CLKIN). When RESET2 is high, the output of inverting multiplexer 345A is high (VCC) and the output of inverting multiplexer 345B is low (ground). When RESET2 is low, the output of inverting multiplexer 345A (345B) is inverted CLKINB (inverted CLKIN). The output of inverting multiplexer 345A is coupled to the gate of PFETs T16 and T19 and an NFET T25 (node P22). The output of inverting multiplexer 345B is coupled to the gate of NFETs T21 and T18 and a PFET T26 (node P23). The drain of PFET T26 and the source of NFET T25 are coupled to node P21. The source of PFET T26 and the drain of NFET T25 are coupled to form a node P24 hence forming a transmission gate. The gates of PFETs T15 and T20 and NFETs T17 and T22 are coupled to node P24. The 2 divider 110 is completed by a pull down NFET T25, the drain of NFET T27 coupled to node P21, the source of NFET T27 coupled to ground, and the gate of NFET T27 coupled to RESET2. When RESET 2 is high, NFET T27 is on and node P21 is pulled low. With node P21 low, CLKOUT2 is high and no division occurs.

In operation, when RESET2 is high, node P21 transitions to 0, node P22 transitions to 1 and node P23 transitions to 0, PFETs T16 and T20 and NFETs T18 and T22 are off, nodes P18 and P19 hang, NFET T25 and PFET T26 are on and P21=P24=0. When RESET2 transitions to 0 and if CLKIN=1 and CLKINB=0 then node P22=1, node P23=0, PFETs T16 and T20 and NFETs T18 and T22 are off, nodes P18 and P19 hang, NFET T25 and PFET T26 are on and P21=P24=0. The 2 divider 110 is essentially a divide by 2 state machine having four states which transition in the following order.

In state 1, when RESET2 transitions to 0, CLKIN=0 and CLKINB=1, then node P22 transitions to 0, node P23 transitions to 1, PFETs T15, T16, T19 and T20 are on, NFETs T18 and T22 are on, node P18=1, node P19=1, NFET T24 is on, node P20 transitions to 0, node P21 transitions to 1, CLKOUT2 transitions to 0, NFET T25 and PFET T26 are off so node P24=0.

In state 2, when CLKIN transitions to 1 and CLKINB transitions to 0, then node P24=0, node P22 transitions to 1, node P23 transitions to 0, PFETs T16 and T20 are off, NFETs T18 and T22 are off, nodes P18 and P19 hang at 1, NFET T24 is on, node P20=0, node P21=1, CLKOUT2=0, NFET T25 and PFET T26 are on so node P21 transitions to 1 and node P24 transitions to 1.

In state 3, when CLKIN transitions to 0 and CLKINB transitions to 1, then node P22 transitions to 0, node P23 transitions to 1, PFETs T16 and T20 are on, NFETs T18 and T22 are on, node P18 transitions to 0, node P19 transitions to 0, PFET T23 is on, NFET T24 is off, node P20 transitions to 1, node P21 transitions to 0 and CLKOUT2 transitions to 1, NFET T26 are off so node P24=0 so node P24=1 retaining its previous value.

In state 4, when CLKIN transitions to 1 and CLKINB transitions to 0, then node P22 transitions to 1, node P23 transitions to 0, PFET T26 and NFET T25 are on, nodes P24 and P21 are equal, PFETs T16 and T20 are off, NFETs T18 and T22 are off, nodes P18 and P19 hand at 0, PFET T23 is on, NFET T24 is off, node P20=1, node P21=0 and CLKOUT2 transitions to 1.

The fours states of 2 divider 110 are illustrated in TABLE VI.

TABLE VI

| Node P24 | CLKIN | CLKOUT2 |
|---|---|---|
| 0 | 0 | 0 |
| 0 | 1 | 0 |
| 1 | 0 | 1 |
| 1 | 1 | 1 |

FIG. 10 is a schematic diagram of a first fast master/slave latch (hereinafter MS1 latch) 400 according to the present invention. MS1 latch 400 is exemplary of latches 460, 465, 470 and 475 of FIG. 12. described infra. In FIG. 10, MS1 latch 400 includes a master latch 405 and a slave latch 410. Master latch 405 includes a NAND gate 415 comprised of PFETs (P-channel field effect transistor) T31 and T34 and NFETs (N-channel field effect transistor) T32, T33, T35 and T36 and a first N-clocked inverter stage 420 comprised of PFET T37 and NFETs T38 and T39. Slave latch 410 a second first P-clocked inverter stage 425 comprised of a PFET T40 and T41 and an NFET T42 and a second P-clocked clocked inverter 430 comprised of PFETs T44 and T45 and an NFET T46. A reset NFET T43 is coupled to first P-clocked inverter stage 425.

The sources of PFETs T31, T34, T37, T40 and T44 are connected to VCC and the sources of NFETs T33, T36, T39, T43, T42 and T46 are connected to ground. The gates of PFETs T31, T41 and T45 and NFETs T32, T35 and T38 are connected to the C (clock) input of MS1 400. The gates of PFET T34 and NFETs T33 and T36 are connected to the D (data) input of MS1 400. The drains of PFETs T31 and T34 and NFETs T32 and T35 and the gates of PFET T37 and NFET T39 are connected to a node P25. The source of NFET T38 is connected to the drain of NFET T39. The drains of PFET T37 and NFETs T38 and T43 and the gates of PFET T40 and NFET T42 are connected to a storage node P26. The drains of PFET T41 and NFET T42 and the gates of PFET T44 and NFET T46 are connected to a storage node P27. The drain of PFET T40 is connected to the source of PFET T41. The drains of PFET T45 and NFET T46 are connected to the output (Q) of MS1 latch 400. RESET is connected to the gate of NFET T43.

In a first state, on a clock (C) transition from low to high, if the data signal (D) is 0 then node P25 goes to 1 and storage node P26 stores a 0. First P-clocked inverter stage 425 blocks propagation of the data to storage node P27. If D is 1, then P25 goes to 0, storage P26 goes to 1 and first P-clocked inverter stage 425 lets allows propagation of the data (with inversion) into to storage node P27 and storage node P27 goes to 0. Second P-clocked inverter stage 430 blocks propagation of the data to output Q. Output Q is thus isolated from the storage nodes P26 and P27.

In a second state, on a clock (C) transition from high to low, node P25 goes high and the N-clocked inverter stage blocks propagation of the data to storage node P26 and storage node P26 retains the value stored before the clock transition.

In the second state, if the data signal (D) in the first state was 0 then storage node P26 remains a 0 and first P-clocked inverter stage 425 passes the data on storage node P26 (with inversion) to storage node P27 and second P-clocked 430 passes the data on storage node P27 (with inversion) to output Q which goes low.

In the second state, if the data signal (D) in the first state was 1 then storage node P27 remains at 0 and second P-clocked 430 passes the data on storage node P27 (with inversion) to output Q, which goes high.

It should be noted that when D is low, the 0 is stored on storage node P26 but when D is 1, the 1 is stored on both storage node P26 and P27.

FIG. 11 is a schematic diagram of a second fast master/slave latch (herein after MS2) 435 according to embodiments of the present invention. In FIG. 11, clocks C and CN are complementary, when C is high, CN is low and when C is low CN is high. In FIG. 11, MS2 latch 435 includes master latch 405 and a slave latch 440. Master latch 405 has been described supra with respect to FIG. 10. Slave latch 440 includes a dual-clocked inverter stage 445 comprised of PFETs T47 and T48 and NFETs T49 and T50 and an inverter 450 comprised of a PFETs T52 and an NFET T53. A reset NFET T51 is coupled to dual-clocked inverter stage 445.

The sources of PFETs T47 and T52 are connected to VCC and the sources of NFETs T51, T50 and T53 are connected to ground. The gate of PFET T48 is connected to the C (clock) input of MS2 latch 435. The gate of NFET T49 is connected to the CN (clock complement) input of MS2 latch 435. The gates of PFET T47 and NFET T50 and the drain of NFET T51 are connected to storage node P26. The drain of PFET T47 is connected to the source of PFET T48 and the source of NFET T49 is connected to the drain of NFET T50. The gates of PFET T52 and NFET T53 are connected to a node P28. The drains of PFET T52 and NFET T53 are connected to the output (Q) of MS2 latch 435. RESET is connected to the gate of NFET T51.

Operation of MS2 latch 435 is similar to operation of MS1 latch 400 of FIG. 10 except there is only one storage node (P26) which store the value of D whether it a 1 or a 0. MS2 latch 435 has an advantage in that slave latch 440 transmission time for the stored value to reach Q is evenly balanced.

Figure 12:
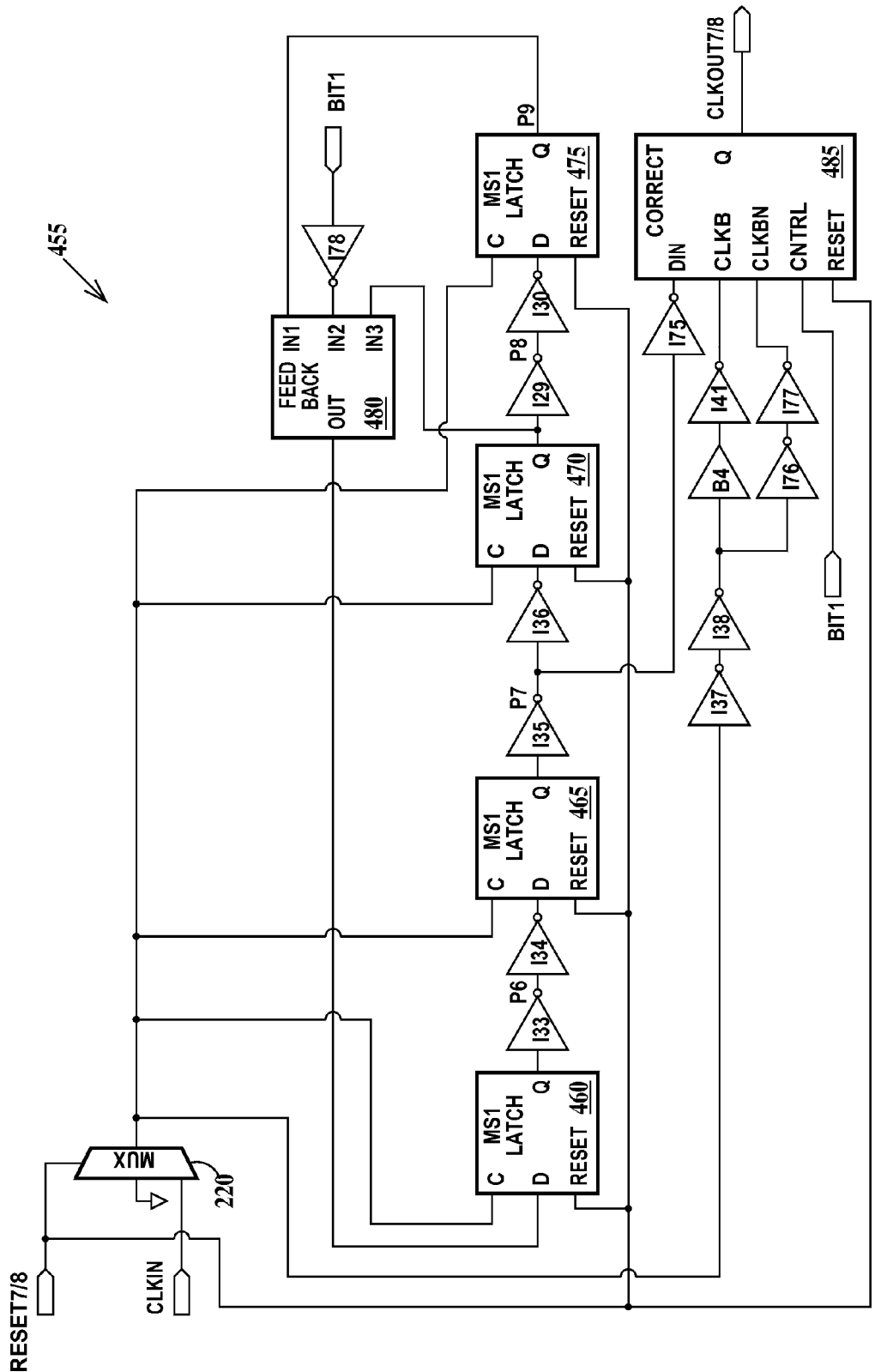
FIG. 12 is a schematic diagram of an exemplary frequency divider circuit that may advantageously utilize the first and second fast master/slave latches according to embodiments of the present invention.

FIG. 12 is a schematic diagram of an exemplary frequency divider circuit 455 that may advantageously utilize the first and second fast master/slave latches according to embodiments of the present invention. In FIG. 12, frequency divider circuit 455 is similar to frequency divider circuit 125 of FIG. 4 except the following differences:

(1) latches 230, 235, 240 and 245 of FIG. 4 are replaced respectfully with latches 460, 465, 470 and 475, which are MS1 latches 400 (see FIG. 10) latches;

(2) the one shot generators 225A and 225B of FIG. 4 are eliminated and the clock inputs (C) of latches 460, 465, 470 and 475 (latch 460 is the first and latch 475 is the last latch of a register comprised of latches 460, 465, 470 and 475) connected directly to the output of multiplexer 220;

(3) NAND gates N9 and N8 are replaced with a feedback circuit 480, the output of the feedback circuit connected to the data (D) input of latch (first latch) 460, the output Q of latch (the next to last latch) 475 connected to an IN3 input of feedback circuit 480, the output Q of latch 475 (the last latch) connected to an IN1 input of feedback circuit 480 and the BIT1 input coupled through an inverter I78 to an IN2 input of feedback circuit 480;

(4) duty cycle correction circuit 250 of FIG. 4 is replaced with duty cycle correction circuit 485, the output of inverter I35 coupled to the data in (DIN) input of duty cycle correction circuit 485 through an inverter I75;

(5) inverters I39 and I40 of FIG. 4 replaced with a buffer B4; and (6) inverters I76 and I77 coupled in series between the output of inverter I38 and a CLKBN input of duty cycle correction circuit 485.

Duty cycle correction circuit 485 advantageously utilizes a MS2 latch (see FIG. 11) in the circuit as illustrated in FIG. 12, in which case the delays of buffer B4 and inverter I41 may be tuned so the total delay though buffer B4 and inverter I41 matches the total delay through inverters I76 and I77. Alternatively, duty cycle correction circuit 485 may utilize a MS1 latch (see FIG. 10) in which case inverters I76 and I77 and input CLKBN are eliminated.

Frequency divider circuit 455 is a divide by 7 or 8 frequency divider circuit and should be considered exemplary of a homologous series of frequency dividers that would differ from frequency divider circuit 455 only in the number of MS1 latches 400 in the register similarly to homologous series of frequency divider circuits illustrated in FIGS. 2B, 3, 4, and 5. Thus, a 3 or 4 frequency divider circuit would use a series of two MS1 latches 400, a 5 or 6 frequency divider circuit would utilize a series of three MS1 latches 400 and a 9 or 10 frequency divider circuit would utilize a series of five MS1 latches 400, etc. Homologue frequency dividers utilizing MS1 latches 400 may replace frequency dividers 115, 120, 125 and 130 of FIG. 1.

Figure 13A:
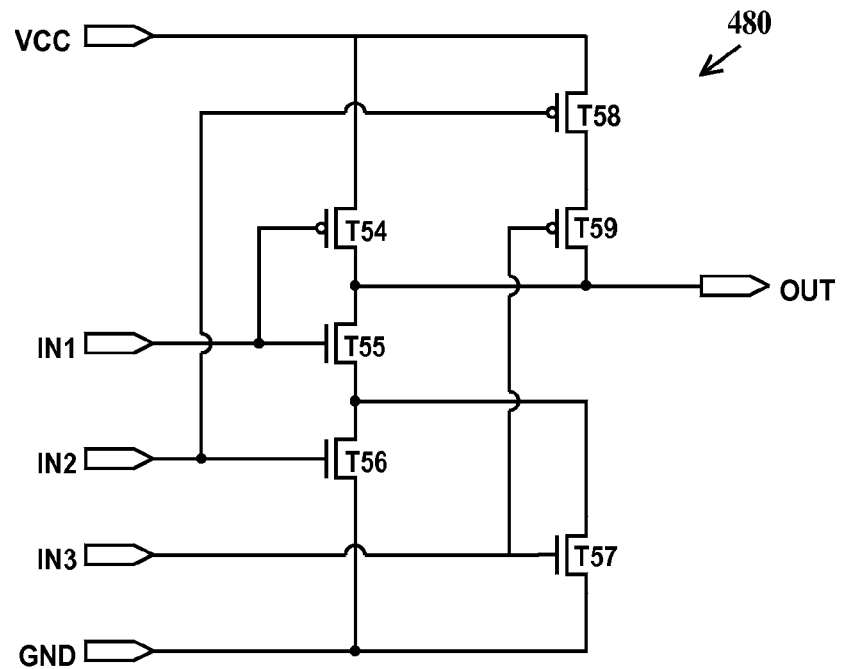
FIG. 13A is a schematic diagram of the feedback circuit of FIG. 12.

FIG. 13A is a schematic diagram of the feedback circuit of FIG. 12. In FIG. 13A, feedback circuit 480 comprises NFETs T55, T56 and T57 and PFETs T54, T58 and T59. The gates of PFET T54 and NFET T55 are connected to input IN1. The gates of NFET T56 and PFET T58 are connected to input IN2 and the gates of NFET T57 and PFET T59 are connected to input IN3. The source of PFET T54 and source of PFET T59 are connected to VCC and sources of NFETs T56 and T57 are connected to ground. The drain of PFET T54 and drains of NFET T55 and PFET T59 are connected to output OUT. The drain of PFET T58 is connected to the source of PFET T59 and the sources of NFETs T55 and T57 are connected to the drain of NFET T56. It should be remembered that BIT1 is coupled through inverter I78 to IN2 (see FIG. 12).

Figure 13B:
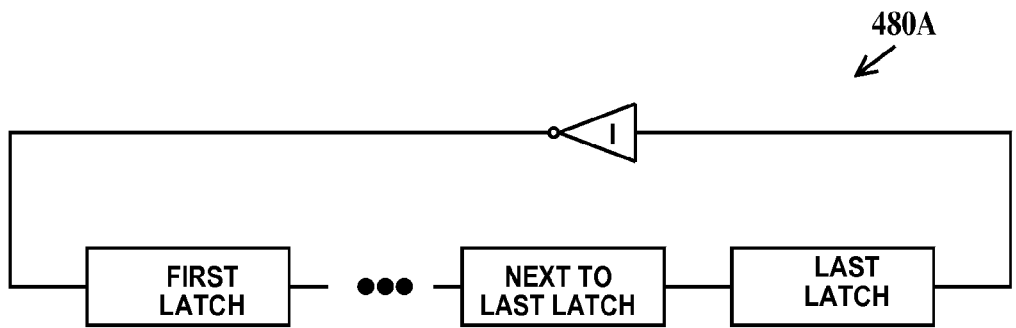
FIG. 13B, is block diagram of an exemplary frequency divider homologue circuit for an even integer divide according to embodiments of the present invention n.

FIG. 13B, is block diagram of a exemplary frequency divider homologue circuit for an even integer divide according to embodiments of the present invention. Only the shift register latches and equivalent logic gate that feedback circuit 480 (see FIG. 13A) reduces to are illustrated. In FIG. 13B, for a even divide (BIT1=0) a feedback circuit 480A is equivalent to an inverter I coupled between the Q output of the last latch and D input to of the first latch. TABLE VI indicates the data stored on each latch for the divide by 7 or 8 frequency divider 455 of FIG. 12.

TABLE VI

| CLK Cycle | Latch 1 | Latch 2 | Latch 3 | Latch 4 |
|---|---|---|---|---|
| 1 | 1 | 1 | 1 | 1 |
| 2 | 0 | 1 | 1 | 1 |
| 3 | 0 | 0 | 1 | 1 |
| 4 | 0 | 0 | 0 | 1 |
| 5 | 0 | 0 | 0 | 0 |
| 6 | 1 | 0 | 0 | 0 |
| 7 | 1 | 1 | 0 | 0 |
| 8 | 1 | 1 | 1 | 0 |
| 9 | 1 | 1 | 1 | 1 |

Figure 13C:
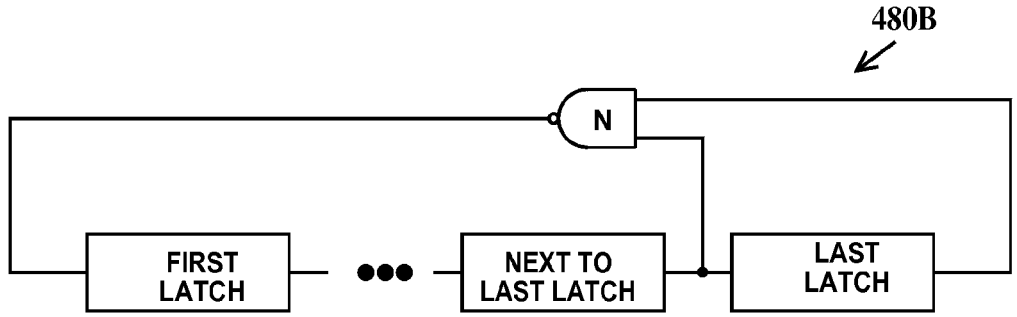
FIG. 13C, is block diagram of a exemplary frequency divider homologue circuit for an odd integer divide according to embodiments of the present invention.

FIG. 13C, is block diagram of a exemplary frequency divider homologue circuit for an odd integer divide according to embodiments of the present invention. Only the shift register latches and equivalent logic gate that feedback circuit 480 (see FIG. 13A) reduces to are illustrated. In FIG. 13C, for a odd divide (BIT1=1) a feedback circuit 480B is equivalent to a NAND gate N having a first input coupled to the Q output of the last latch, a second input coupled to the Q output of the next to last latch and an output coupled to the D input to of the first latch. TABLE VII indicates the data stored on each latch for the divide by 7 or 8 frequency divider 455 of FIG. 12.

TABLE VII

| CLK Cycle | Latch 1 | Latch 2 | Latch 3 | Latch 4 |
|---|---|---|---|---|
| 1 | 1 | 1 | 1 | 1 |
| 2 | 0 | 1 | 1 | 1 |
| 3 | 0 | 0 | 1 | 1 |
| 4 | 0 | 0 | 0 | 1 |
| 5 | 1 | 0 | 0 | 0 |
| 6 | 1 | 1 | 0 | 0 |
| 7 | 1 | 1 | 1 | 0 |
| 8 | 1 | 1 | 1 | 1 |

The Master Transmission time (MTT) of a MS1 latch is defined as the time taken for data to get stored as the clock signal transitions from low to high assuming data is already presented to the input of the input of the latch is ready before the C transition. Slave Transmission time (STT) of a MS1 latch is defined as the time taken for stored data to reach the input of the next MS1 latch after C transitions from high to low, assuming data is already stored in the slave latch before the C transition. Therefore, the highest frequency of a divider (FREQMAX) using MS1 latches 400 is given by equation 3:

$$FREQMAX=1/(2\times[Max\ of\ \{MTT, STT\}]) \quad (3)$$

In, one example, homologue frequency dividers having shift registers comprising MS1 latches 400 are capable of running at frequencies between about 100 MHz and about 4.5 GHz while drawing about 6 mA.

Figure 14:
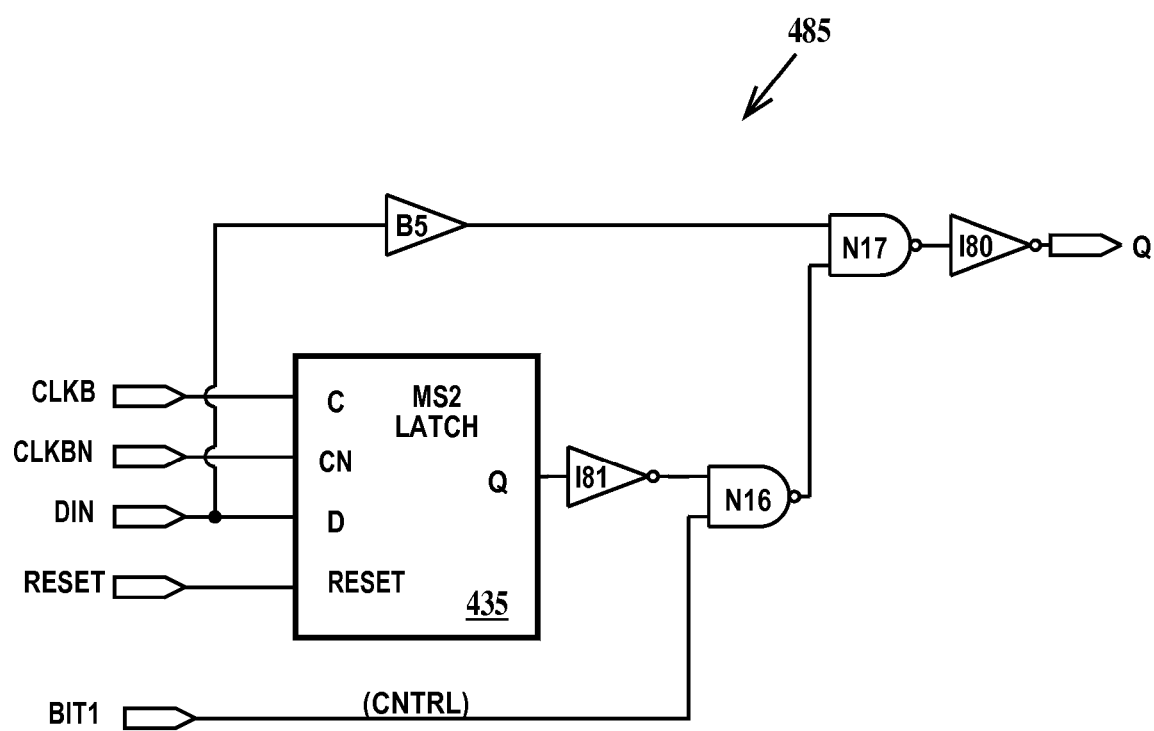
FIG. 14 is a schematic diagram of the clock duty cycle correction circuit of FIG. 12.

FIG. 14 is a schematic diagram of clock duty cycle correction circuit 485 of FIG. 12. In FIG. 14, duty cycle correction circuit 485 includes a MS2 latch 435. Duty cycle correction circuit 485 is required only for odd divides because the output is, in the case of a divide by 7) "1 1 1 1 0 0 0." (see TABLE VII). This is advantageously corrected to be 50%.

In FIG. 14, duty cycle correction circuit includes a MS2 latch 235, a buffer B5, NAND gates N16 and N17 and an inverter I80. The CLKB signal is connected to the C input, the CLKBN signal is connected to the CN input, the DIN signal is connected to the D input and the RESET signal is connected to the RESET input of MS2 latch 435. The DIN signal is also connected to the input of buffer B5. The BIT1 signal is connected to a first input of NAND gate N16 and the Q output of MS2 latch 435 is coupled to a second input of NAND gate N16 through inverter I81. The output of buffer B5 is connected to a first input of NAND gate N17 and the output of NAND gate N16 is connected to a second input of NAND gate N17. The output of NAND gate N17 is coupled to the output Q of MS2 latch 235 through an inverter I80.

Duty cycle correction circuit 485 operates by MS2 latch 435 shifting the DIN signal by half a period followed by a logically AND of the original DIN signal and the half-period shifted signal (at Q) to produce 50% duty cycle output.

A comparison chart for Slave transmission time between MS1 latch 400 and the MS2 latch 435 is given in TABLE VII. These values are for a specific corner (VCC voltage level, operating temperature and process specification limit), for comparison purpose.

TABLE VII

| | Slave Transmission Time | |
|---|---|---|
| | Q Rise | Q FALL |
| MS1 Latch | 21.5 ps | 45 ps |
| MS2 Latch | 43 ps | 44 ps |

Thus the present invention provides latches and frequency divider circuits with high-speed and with low power consumption.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention

What is claimed is:

1. A master/slave latch comprising:
a master latch comprising:
a NAND gate having a first clock signal input, a data signal input and an output; and
an N-clocked inverter stage, a first input of said N-clocked inverter stage connected to said output of said NAND gate and a second input of said clocked inverter connected to said first clock signal input; and
a slave latch, comprising:
a first dual-clocked inverter stage, a first input of said dual-clocked inverter stage connected to an output of said N-clocked inverter stage, a second input of said dual-clocked inverter stage connected to said first clock signal input and a third input of said dual-clocked inverter stage connected to a second clock signal input; and
an inverter stage having an output, an input of said inverter stage connected to an output of said dual-clocked inverter stage.

2. The master/slave latch of claim 1, further including:
an FET; and
a reset signal input, a first source/drain of said FET connected to a voltage terminal of a power supply and said second source/drain of said FET connected to said output of said N-clocked inverter stage, a gate of said FET connected to said reset signal input.

3. The master/slave latch of claim 1, wherein said N-clocked inverter stage comprises:
a PFET, a first NFET and a second NFET, a gate of said first NFET connected to said first clock signal input, gates of said PFET and said second NFET connected to said first input of said N-clocked inverter stage, drains of said PFET and said first NFET connected to an output of said N-clocked inverter stage, a source of said first NFET connected to a drain of said second NFET, a source of said PFET connected to a high voltage terminal of a power supply and a source of the second NFET connected to a low voltage terminal of said power supply.

4. The master/slave latch of claim 1, wherein said dual-clocked inverter stage comprises:
a first PFET, a second PFET, a first NFET and a second NFET, gates of said first PFET and second NFET connected to said first input of said dual clocked inverter stage, a gate of said second PFET connected to said first clock signal input and a gate of said first NFET connected to said second clock signal input, drains of said second PFET and said first NFET connected to an output of said first dual-clocked inverter stage, a source of said first NFET connected to a drain of said second NFET, a drain of said first PFET connected a source of said second PFET, a source of said first PFET connected to a high voltage terminal of a power supply and a source of said second NFET connected to ground a low voltage terminal of said power supply.

5. The master/slave latch of claim 1, wherein said master/slave latch has a maximum operating frequency defined as the inverse of twice the higher of the switching time of said master latch and the switching time of said slave latch.

6. The master/slave latch of claim 1, wherein an operating frequency of said master/slave latch is between about 100 MHz and about 9 GHz.

7. The master/slave latch of claim 1, wherein a clock signal on said first clock input is the complement of a clock signal on said second clock input.

8. The master/slave latch of claim 1, wherein said output of said N-clocked inverter stage stores "0" data as a 0 and stores "1" data as a 1.

9. A clock duty cycle correction circuit, comprising:
said master/slave latch according to claim 8;
- a first inverter connected between said output of said inverter stage of said slave latch and a first input of a first NAND gate, a second input of said first NAND gate connected to a control signal input of said duty cycle correction circuit;
- a buffer connected between said data signal input and a first input of a second NAND gate, an output of said first NAND gate connected to a second input of said second NAND gate; and
- a second inverter connected between an output of said second NAND gate and a output of said clock duty cycle correction circuit.

10. The clock duty cycle correction circuit of claim 9, further including a reset signal input connected to a gate of an FET, source/drains of said FET connected between a voltage terminal of a power supply and said output of said N-clocked inverter stage.

11. The clock duty cycle correction circuit of claim 9, wherein said N-clocked inverter stage comprises:
- a PFET, a first NFET and a second NFET, a gate of said first NFET connected to said first clock signal input, gates of said PFET and said second NFET connected to said first input of said N-clocked inverter stage, drains of said PFET and said first NFET connected to an output of said N-clocked inverter stage, a source of said first NFET connected to a drain of said second NFET, a source of said PFET connected to a high voltage terminal of a power supply and a source of the second NFET connected to a low voltage terminal of said power supply.

12. The clock duty cycle correction circuit of claim 9, wherein said dual-clocked inverter stage comprises:
- a first PFET, a second PFET, a first NFET and a second NFET, gates of said first PFET and second NFET connected to said first input of said dual clocked inverter stage, a gate of said second PFET connected to said first clock signal input and a gate of said first NFET connected to said second clock signal input, drains of said second PFET and said first NFET connected to an output of said first dual-clock inverter stage, a source of said first NFET connected to a drain of said second NFET, a drain of said first PFET connected a source of said second PFET, a source of said first PFET connected to a high voltage terminal of a power supply and a source of said second NFET connected to ground a low voltage terminal of said power supply.

* * * * *